US012224480B2

(12) United States Patent
Tang et al.

(10) Patent No.: US 12,224,480 B2
(45) Date of Patent: Feb. 11, 2025

(54) MICROELECTRONIC DEVICE PACKAGE INCLUDING ANTENNA HORN AND SEMICONDUCTOR DEVICE

(71) Applicant: Texas Instruments Incorporated, Dallas, TX (US)

(72) Inventors: Yiqi Tang, Allen, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 294 days.

(21) Appl. No.: 17/736,653

(22) Filed: May 4, 2022

(65) Prior Publication Data

US 2022/0376378 A1 Nov. 24, 2022

Related U.S. Application Data

(60) Provisional application No. 63/192,548, filed on May 24, 2021.

(51) Int. Cl.
| | |
|---|---|
| *H01Q 1/22* | (2006.01) |
| *H01L 23/66* | (2006.01) |
| *H01Q 9/04* | (2006.01) |
| *H01Q 13/02* | (2006.01) |
| *H01Q 19/10* | (2006.01) |

(52) U.S. Cl.
CPC ........... *H01Q 1/2283* (2013.01); *H01L 23/66* (2013.01); *H01Q 9/0407* (2013.01); *H01Q 13/02* (2013.01); *H01Q 19/10* (2013.01); *H01L 2223/6677* (2013.01)

(58) Field of Classification Search
CPC ... H01L 2223/6677; H01L 2224/16225; H01L 23/49822; H01L 23/66; H01L 2924/00012; H01L 2924/181; H01Q 1/2283; H01Q 13/02; H01Q 19/10; H01Q 9/0407
See application file for complete search history.

(56) References Cited

U.S. PATENT DOCUMENTS

| | | | |
|---|---|---|---|
| 9,570,788 B2 * | 2/2017 | Payne | ..................... H01Q 13/02 |
| 9,711,837 B2 * | 7/2017 | Payne | ..................... H01P 5/184 |
| 2014/0240187 A1 * | 8/2014 | Herbsommer | ......... H05K 1/024 |
| | | | 343/785 |

(Continued)

*Primary Examiner* — Thien M Le
(74) *Attorney, Agent, or Firm* — Dawn Jos; Frank D. Cimino

(57) ABSTRACT

An example semiconductor package comprises a patch antenna formed in a first conductor layer of a multilayer package substrate. The multilayer package substrate comprises conductor layers spaced from one another by dielectric material and coupled to one another by conductive vertical connection layers. The multilayer package substrate has a board side surface opposite a device side surface. The semiconductor package further comprises a semiconductor die mounted to the device side surface of the multilayer package substrate spaced from and coupled to the patch antenna. An antenna horn is mounted to the device side surface and aligned with the patch antenna using a mounting structure. The semiconductor package further comprises a reflector formed on a second conductor layer in the multilayer package substrate. The second conductor layer is positioned closer to the board side surface of the multilayer package substrate compared to the patch antenna.

20 Claims, 18 Drawing Sheets

(56) References Cited

U.S. PATENT DOCUMENTS

| | | | |
|---|---|---|---|
| 2014/0285289 A1* | 9/2014 | Herbsommer | H01Q 13/02 |
| | | | 333/248 |
| 2014/0287703 A1* | 9/2014 | Herbsommer | H01Q 13/02 |
| | | | 333/21 R |
| 2018/0218986 A1* | 8/2018 | Kamgaing | H01L 25/0657 |
| 2019/0115643 A1* | 4/2019 | Khan | H01Q 9/42 |
| 2021/0211107 A1* | 7/2021 | Liu | H03F 3/213 |
| 2021/0328367 A1* | 10/2021 | Tang | H01Q 9/285 |
| 2023/0118218 A1* | 4/2023 | Williamson | H01L 23/3121 |
| | | | 257/668 |
| 2024/0038691 A1* | 2/2024 | Khanolkar | H01L 23/66 |
| 2024/0088083 A1* | 3/2024 | Ikeda | H05K 1/0204 |

\* cited by examiner

MICROELECTRONIC DEVICE PACKAGE INCLUDING ANTENNA HORN AND SEMICONDUCTOR DEVICE

CROSS REFERENCE TO RELATED APPLICATIONS

This application claims the benefit of the filing date of U.S. Provisional Patent Application No. 63/192,548, which was filed May 24, 2021, the disclosure of which is hereby incorporated by reference herein in its entirety.

TECHNICAL FIELD

This application relates generally to microelectronic device packages and more particularly to microelectronic device packages including antennas and semiconductor devices.

BACKGROUND

Processes for producing microelectronic device packages include mounting a semiconductor die to a package substrate and covering the electronic devices with a dielectric material such as a mold compound to form packaged devices. Incorporating antennas with semiconductor devices in a microelectronic device package is desirable. Antennas are increasingly used with microelectronic devices and portable devices, such as communications systems, communications devices, including 4G, 5G or LTE capable cellphones, tablets, and smartphones. Additional applications include microelectronic devices in automotive systems such as radar, navigation and over the air communications systems. Mold compounds used in molded microelectronic devices and some substrate materials used when packaging semiconductor devices have high dielectric constants of about 3 or higher, which can interfere with the efficiency of embedded antennas. Systems using antennas with packaged semiconductor devices therefore often place the antennas on a separate printed circuit board, an organic substrate, spaced from the semiconductor devices.

Existing approaches require additional elements, including expensive printed circuit board (PCB) substrates, which are sometimes used inside a module with semiconductor dies, or sometimes used with packaged semiconductor devices provided spaced apart from the antennas. These solutions are relatively high cost and require substantial device area. It is a challenge to form microelectronic device packages having efficient and cost-effective antennas within the packages.

SUMMARY

In an arrangement, a semiconductor package comprises a patch antenna formed in a first conductor layer of a multilayer package substrate. The multilayer package substrate comprises conductor layers spaced from one another by dielectric material and coupled to one another by conductive vertical connection layers. The multilayer package substrate has a board side surface opposite a device side surface. The semiconductor package further comprises a semiconductor die mounted to the device side surface of the multilayer package substrate spaced from and coupled to the patch antenna, and an antenna horn mounted to the device side surface and aligned with the patch antenna. The semiconductor package further comprises a reflector formed on a second conductor layer in the multilayer package substrate. The second conductor layer is positioned closer to the board side surface of the multilayer package substrate compared to the patch antenna. The reflector is aligned with and spaced from the patch antenna.

In one arrangement, the first conductor layer may form a portion of the device side surface of the multilayer package substrate. In another arrangement, the first conductor layer is below and spaced apart from the device side surface of the multilayer package substrate.

The semiconductor package further comprises a ground layer formed on a second conductor layer in the multilayer package substrate. The second conductor layer forms a portion of the device side surface of the multilayer package substrate. In one arrangement, the ground layer surrounds the patch antenna on the device side surface.

The antenna horn may be coupled to the device side surface using solder. In another arrangement, a mounting structure is formed on the device side surface of the multilayer package substrate. The mounting structure is configured to define a desired position of the antenna horn and to attach the antenna horn to the multilayer package substrate. The mounting structure may comprise a first elevated trace formed on the device side surface of the multilayer package substrate. The mounting structure may further comprise a second elevated trace formed on the device side surface of the multilayer package substrate, wherein the first elevated trace surrounds the second elevated trace. The first and second elevated traces may comprise a solid line of material built-up on the device side surface. The first and second elevated traces may comprise a segmented line of material built-up on the device side surface. The antenna horn may be coupled to the mounting structure using solder.

The semiconductor die and the device side surface of the multilayer package substrate may be covered with a mold compound. An outside surface of the antenna horn is also surrounded by the mold compound. In some arrangements, an interior of the antenna horn is filled with the mold compound. In other arrangements, an interior of the antenna horn is air filled and exposed from the mold compound.

In an example microelectronic device package, a multilayer package substrate comprises conductor layers spaced from one another by dielectric material. The multilayer package substrate comprises vertical connections extending through the dielectric material between the conductor layers and coupling portions of the conductor layers one to another. The multilayer package substrate has a device side surface and an opposite board side surface. An antenna is formed in a first conductor layer at or below the device side surface of the multilayer package substrate. A reflector is formed in a second conductor layer of the multilayer package substrate. The reflector is aligned with and spaced away from the antenna by the dielectric material toward the board side surface. A ground plane is formed at the device side surface of the multilayer package substrate. An antenna horn mounting structure is formed on the ground plane and extending above the device side surface. An antenna horn is positioned on the mounting structure and aligned with the antenna. A semiconductor die is mounted to the device side surface of the multilayer package substrate and coupled to the antenna. The antenna may further comprise a planar antenna that is a rectangular, circular, triangular, oval, or E-patch shape. The antenna horn mounting structure may comprise two concentric rings spaced apart to form a slot, and wherein the slot is adapted to receive walls of the antenna horn. The semiconductor die and the device side surface of the multilayer package substrate are covered with mold compound. An outside surface of the antenna horn is surrounded by the mold compound. An interior of the antenna horn is filled with the mold compound in some arrangements. In other arrangements, an interior of the antenna horn is exposed from the mold compound and is air filled.

BRIEF DESCRIPTION OF THE DRAWINGS

Figure 1A:
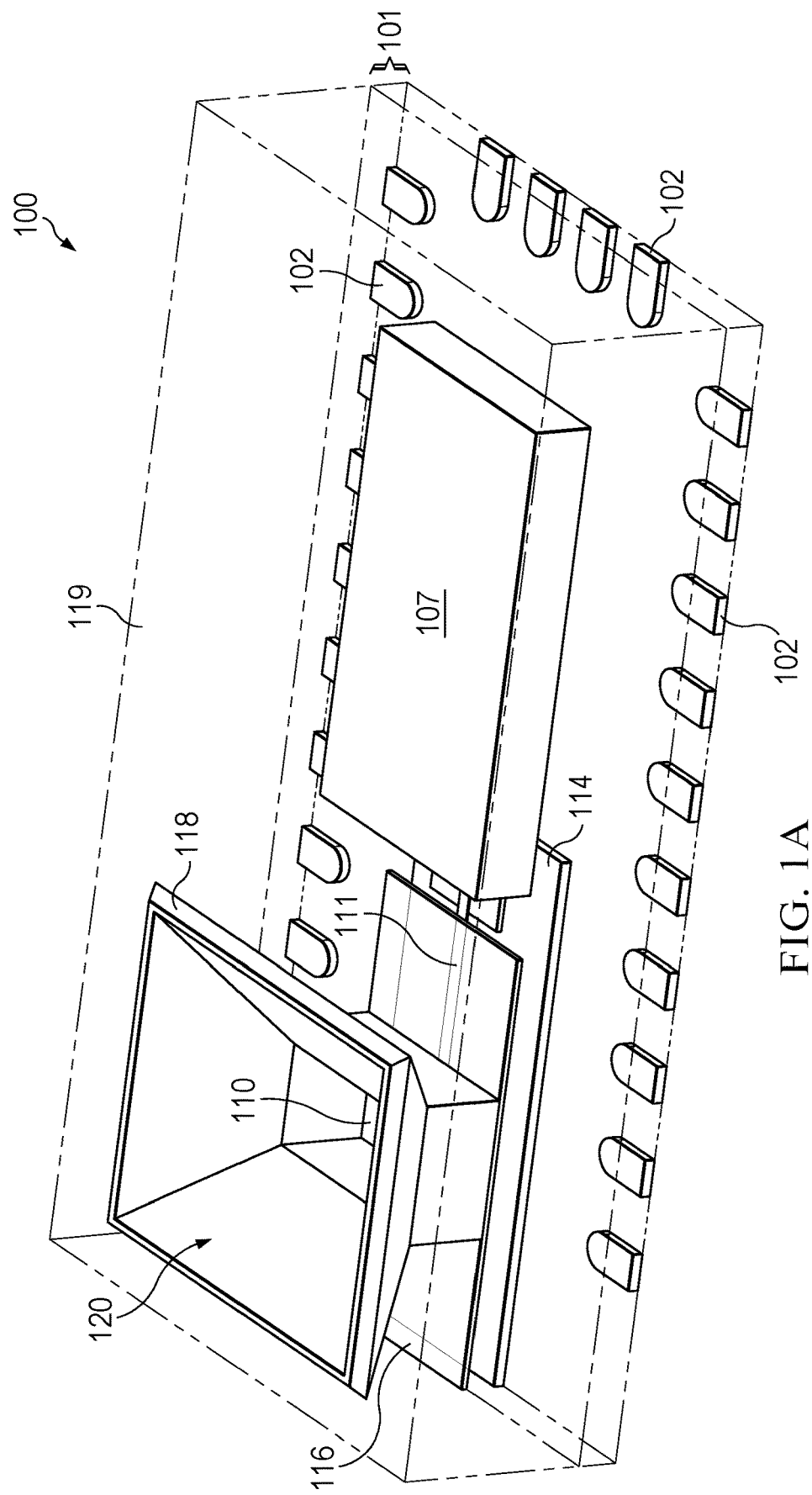
Figure 1B:
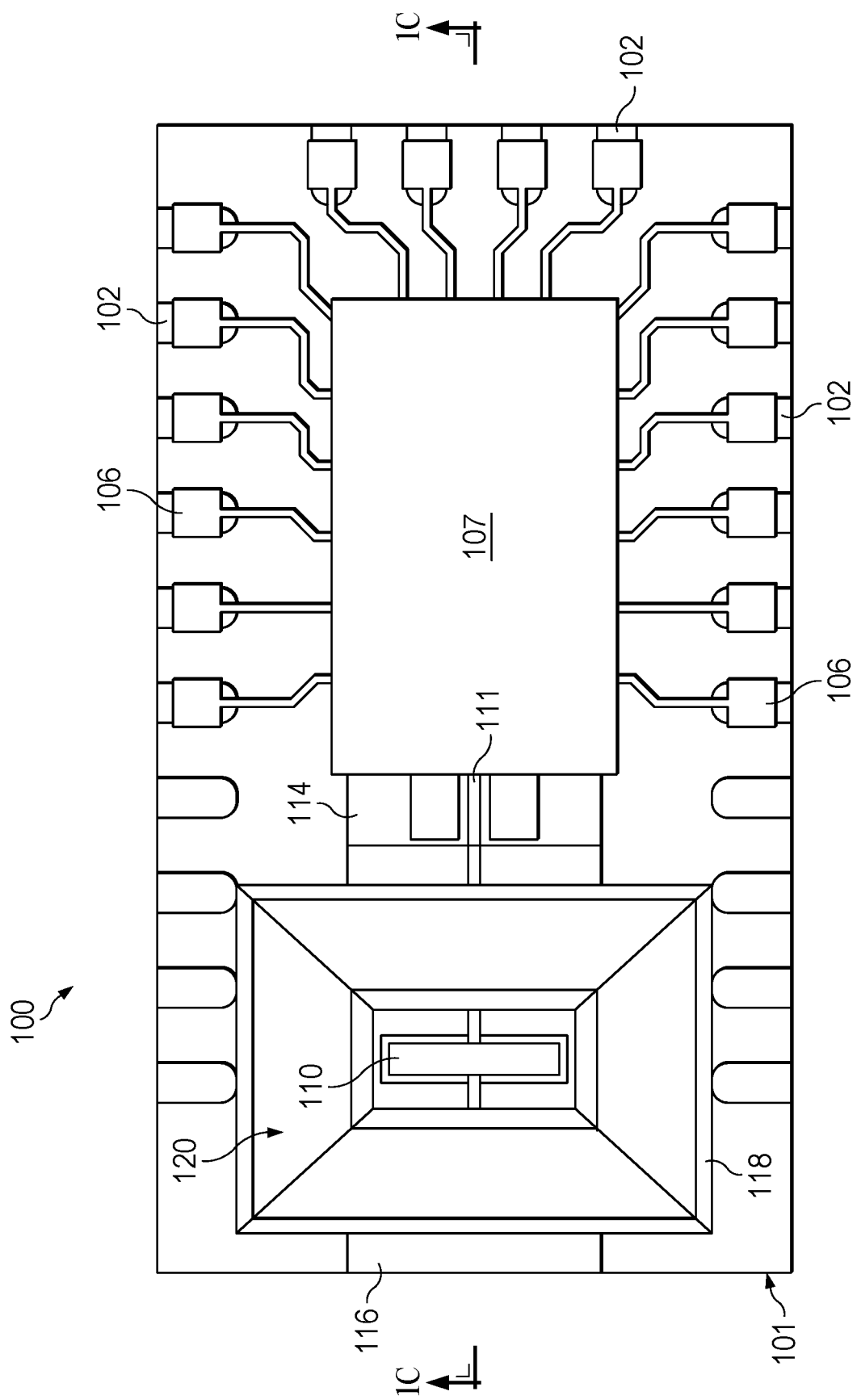
Figure 1C:
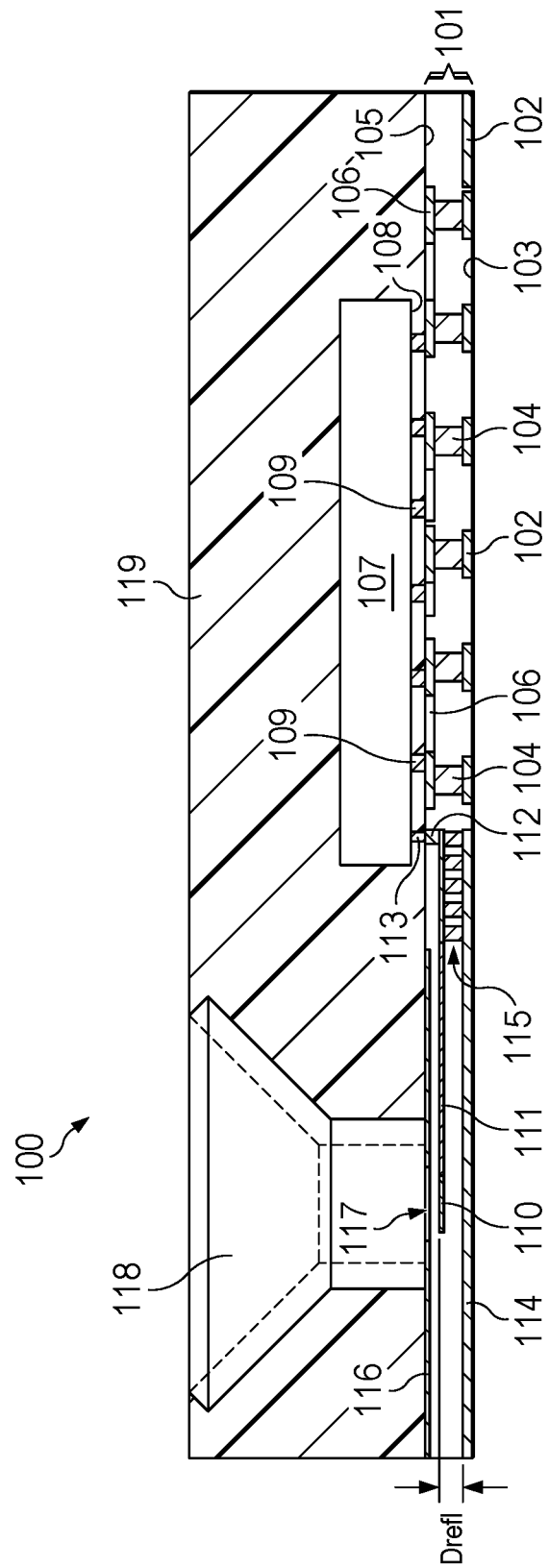
Figure 1D:
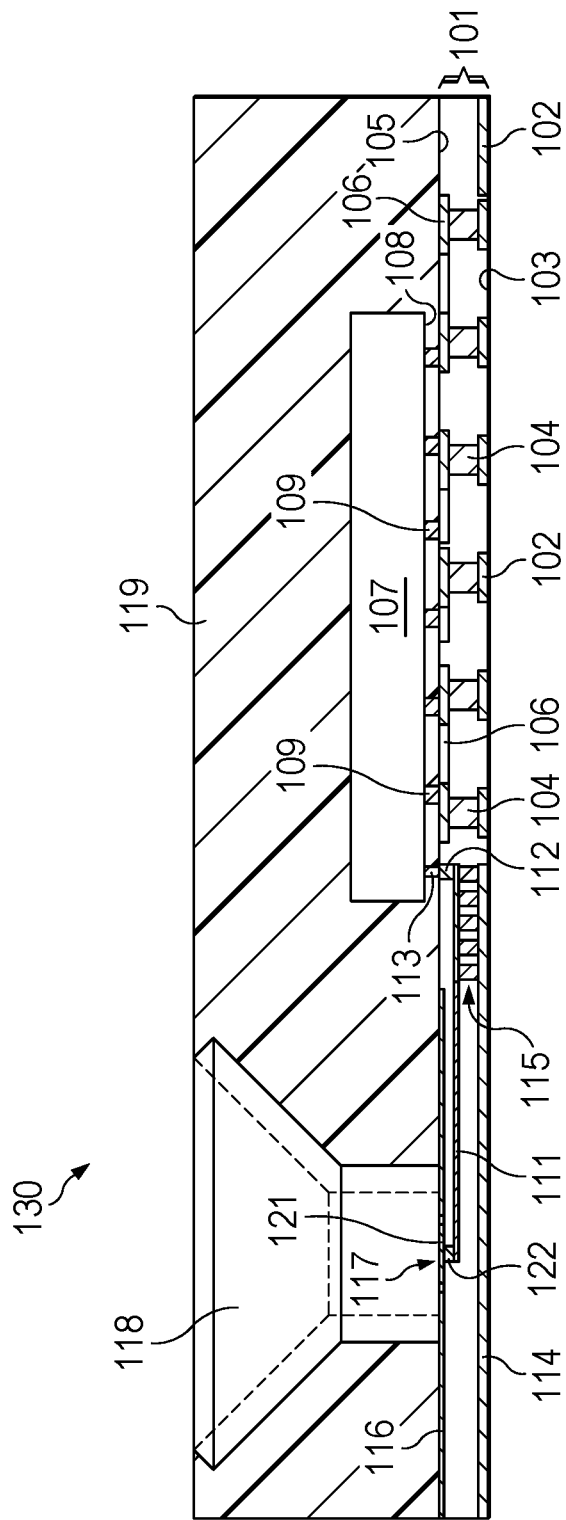

Having thus described the invention in general terms, reference will now be made to the accompanying drawings, wherein:

FIGS. 1A-1C illustrate, in an isometric view, a plan view, and a cross-sectional view, respectively, an example arrangement; FIG. 1D illustrates in a cross-sectional view an alternative arrangement.

Figure 2:
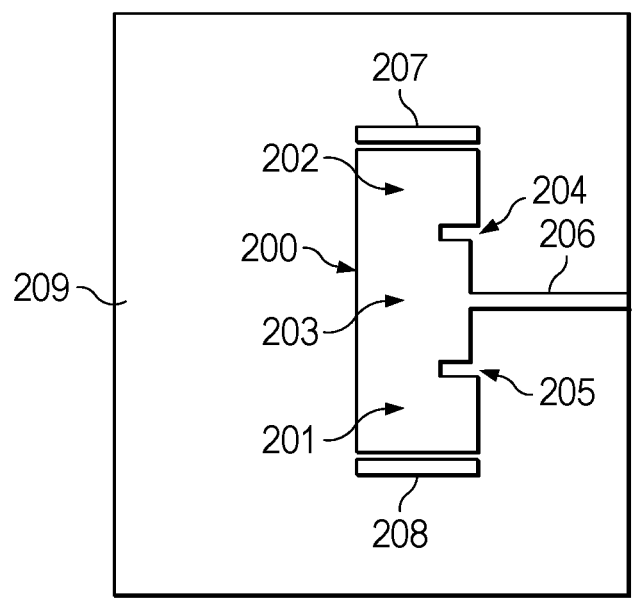

FIG. 2 illustrates, in a plan view, an E-patch antenna that can be used with examples described herein.

Figure 3:
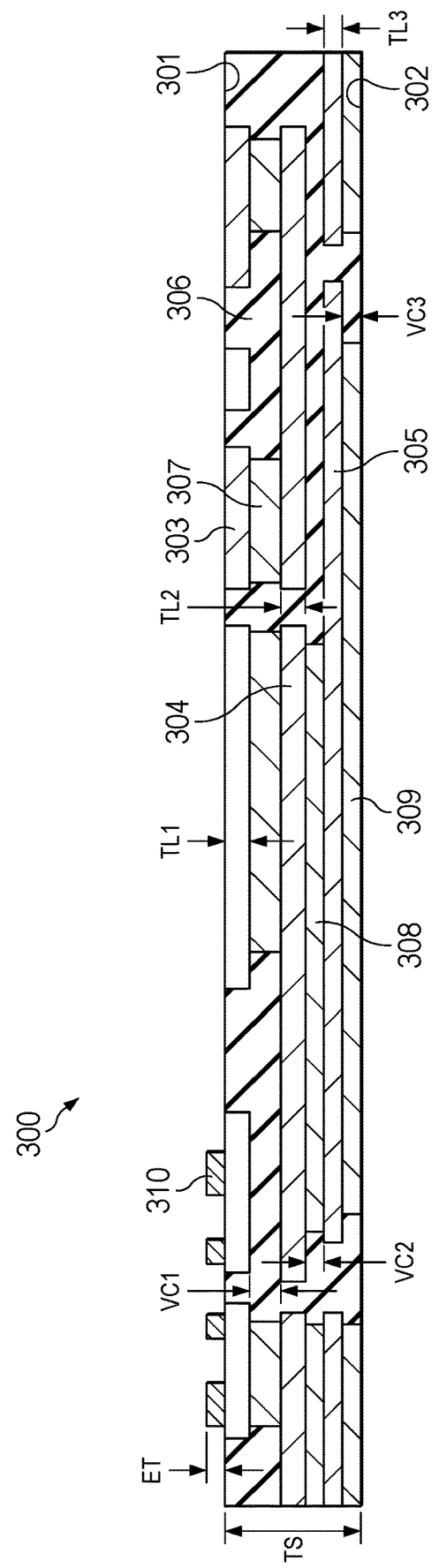

FIG. 3 illustrates, in a cross-sectional view, a multilayer package substrate for use with one example.

Figure 4A:
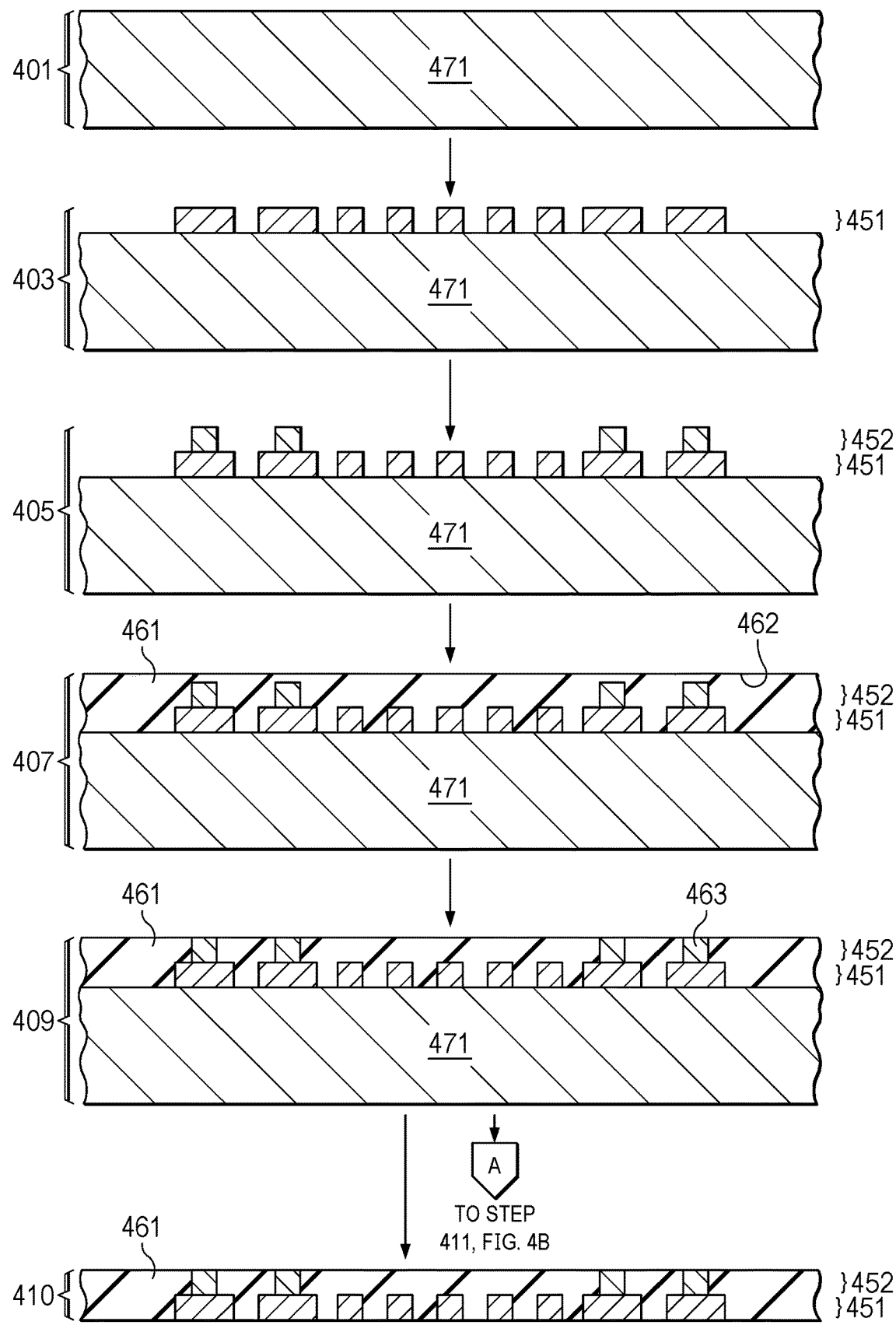
Figure 4B:
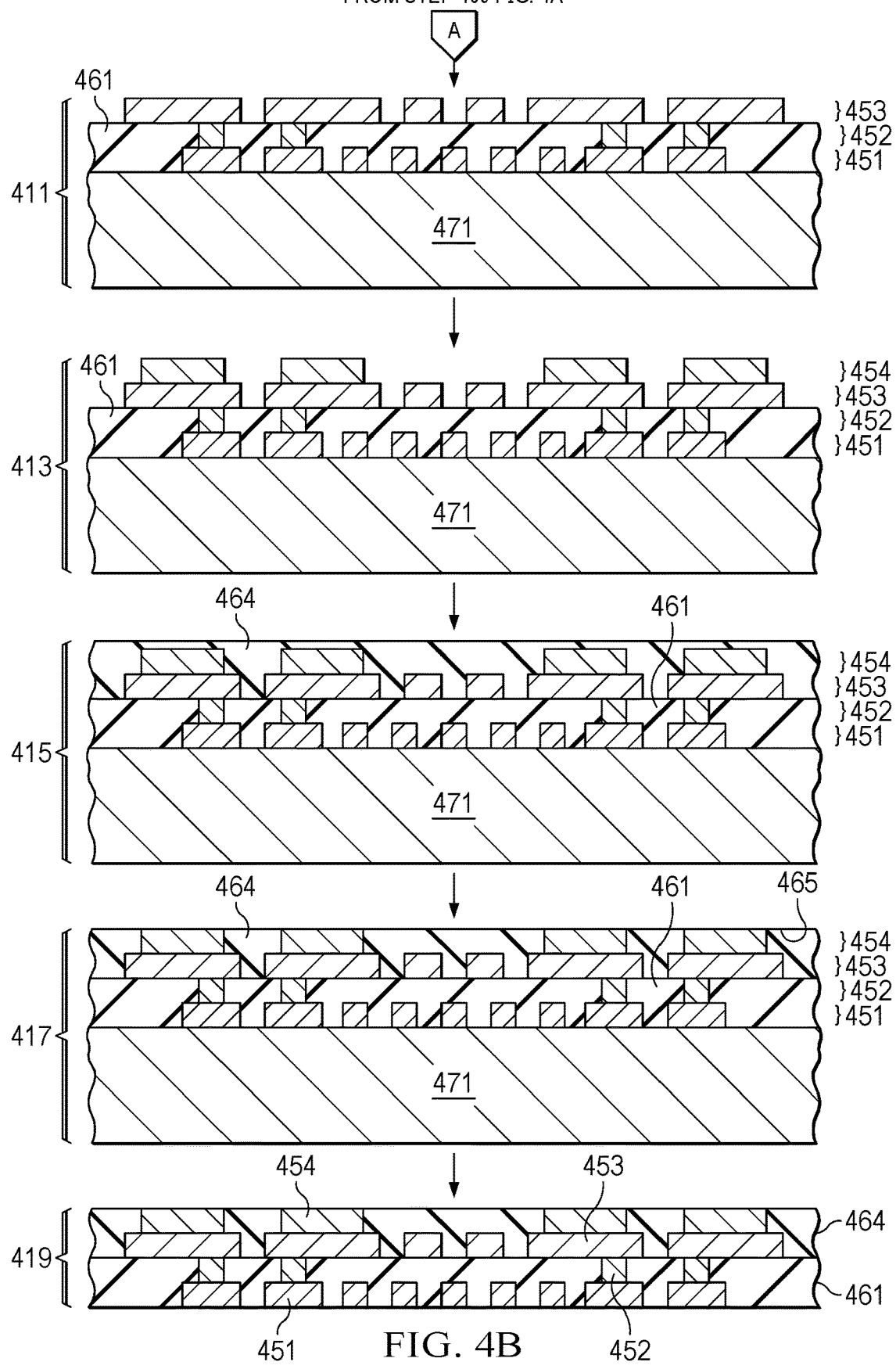

FIGS. 4A-4B illustrate, in a series of cross-sectional views, the major steps in manufacturing a multilayer package substrate that can be used in one example.

Figure 5A:
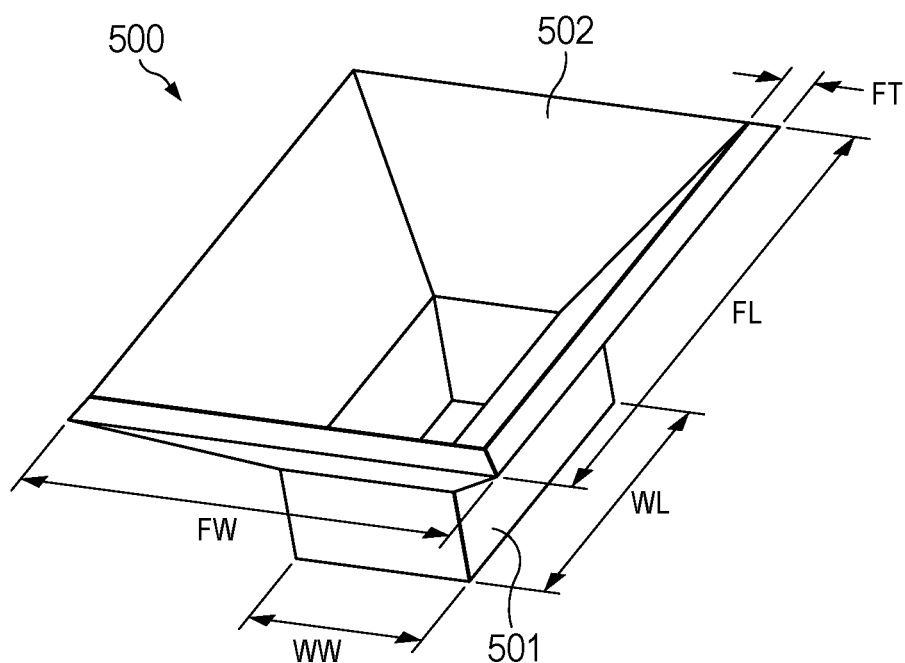
Figure 5B:
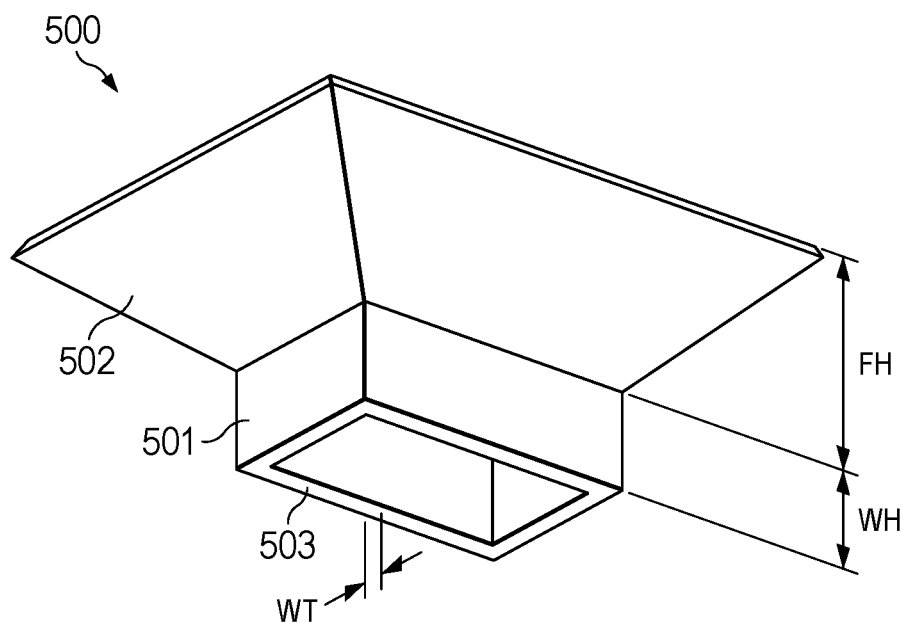

FIGS. 5A and 5B illustrate top and bottom isometric views, respectively, of an antenna horn according to one example.

Figure 6A:
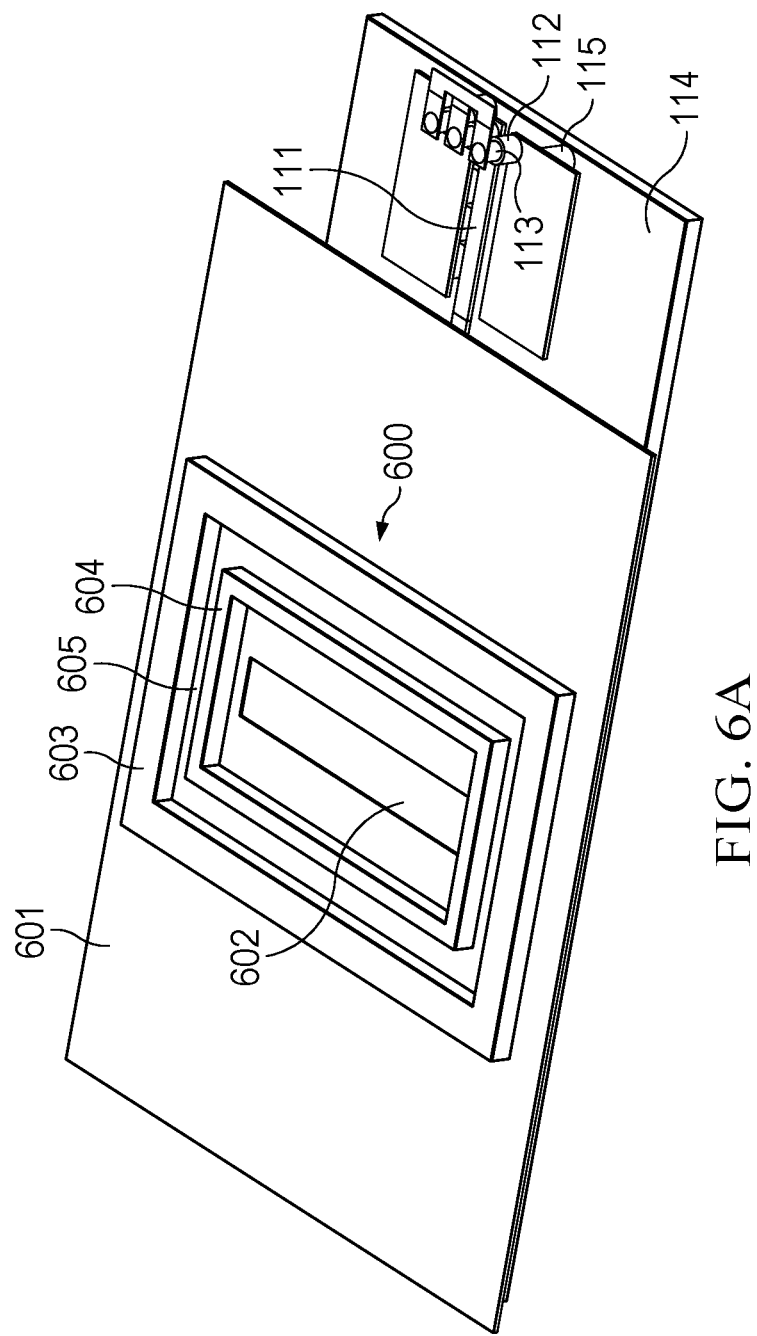
Figure 6B:
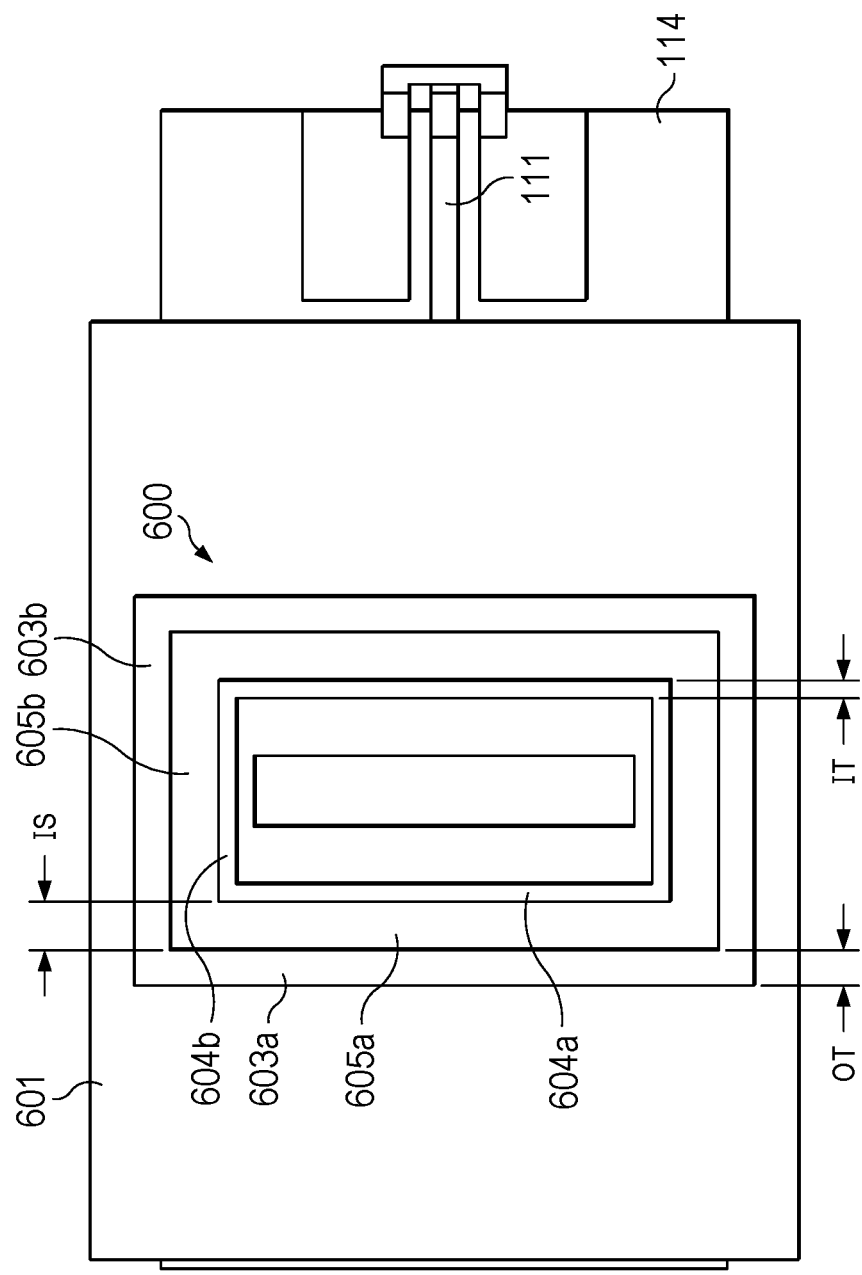
Figure 6C:
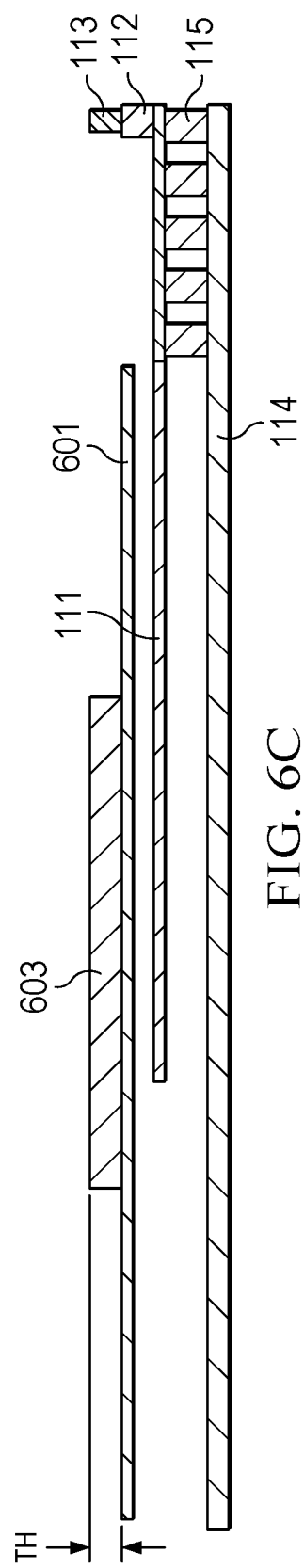
Figure 6D:
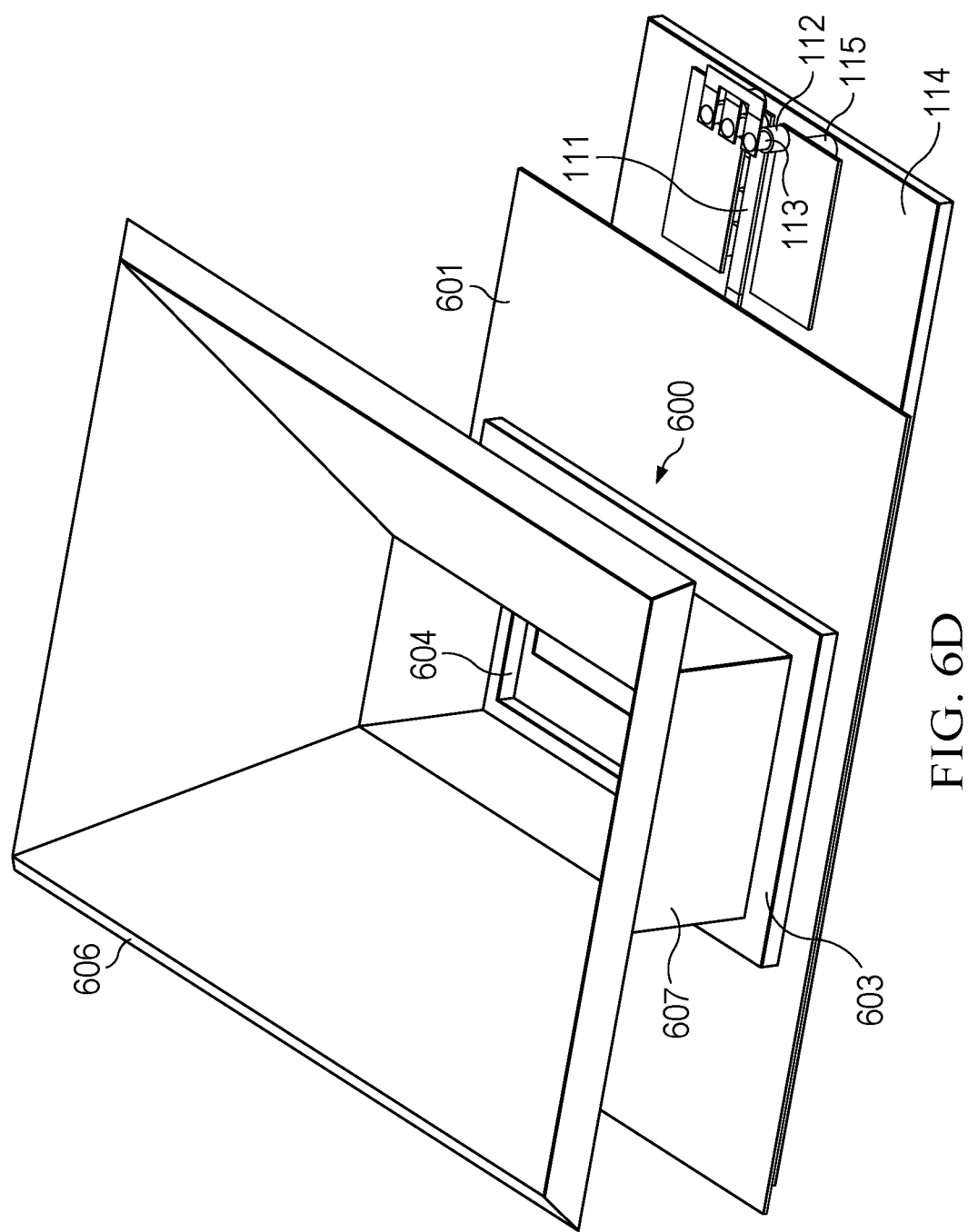
Figure 6E:
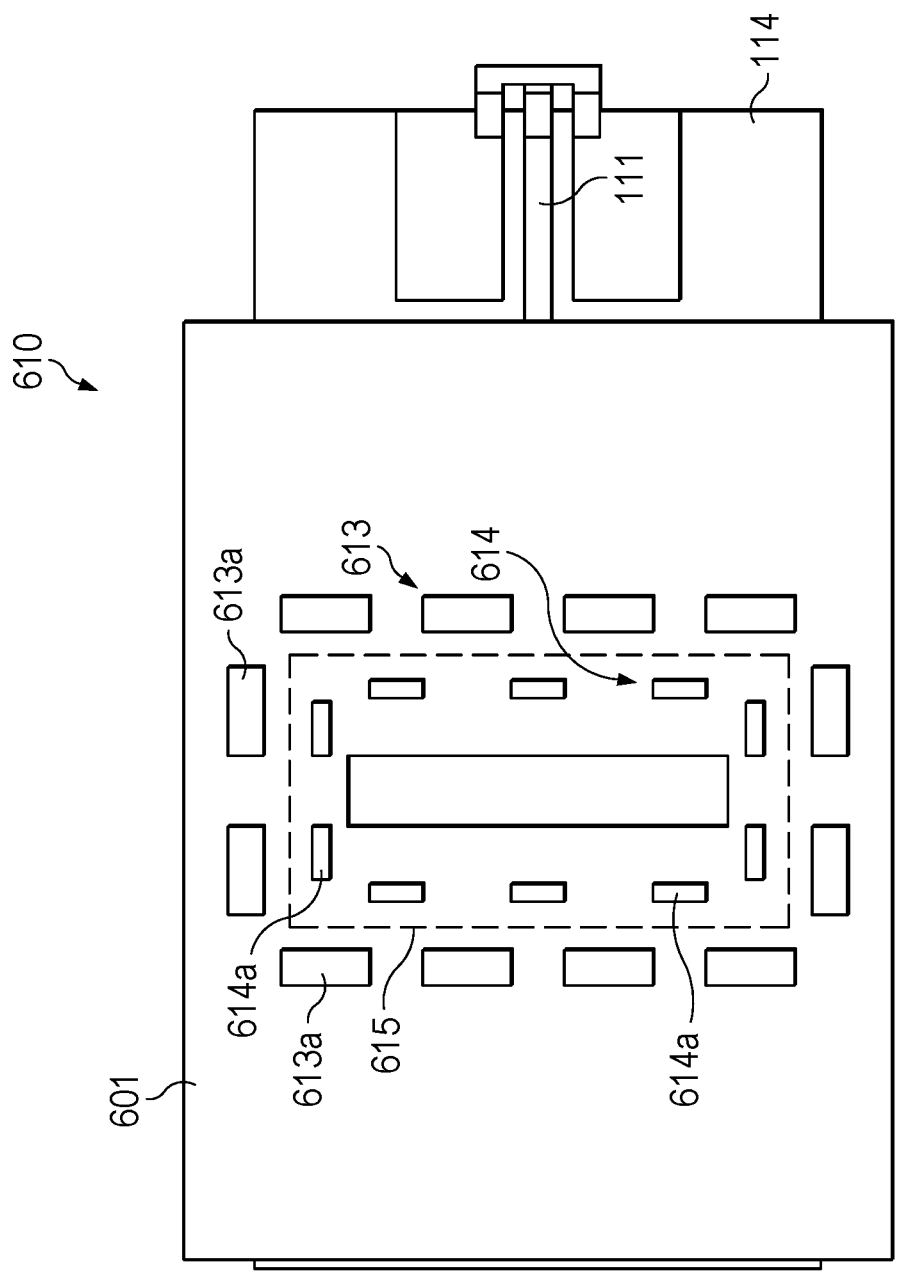

FIGS. 6A-6C illustrate, in an isometric view, a plan view, and a cross-sectional view, respectively, an example arrangement in which an insertion aid structure is incorporated on to a multilayer package substrate for attachment of the antenna horn; FIG. 6D illustrates, in an isometric view, an antenna horn installed on the multilayer package substrate using the insertion aid structure; FIG. 6E illustrates a plan view of a further arrangement of an insertion aid structure.

FIGS. 7A-D illustrate, in a series of cross-sectional views, selected steps for a semiconductor package molding process.

DETAILED DESCRIPTION

The present disclosure is described with reference to the attached figures. The figures are not drawn to scale, and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Corresponding numerals and symbols in the different figures generally refer to corresponding parts, unless otherwise indicated. The figures are not necessarily drawn to scale. In the drawings, like reference numerals refer to like elements throughout, and the various features are not necessarily drawn to scale. In the following discussion and in the claims, the terms "including," "includes," "having," "has," "with," or variants thereof are intended to be inclusive in a manner similar to the term "comprising," and thus should be interpreted to mean "including, but not limited to . . . " Also, the terms "coupled," "couple," and/or or "couples" is/are intended to include indirect or direct electrical or mechanical connection or combinations thereof. For example, if a first device couples to or is electrically coupled with a second device that connection may be through a direct electrical connection, or through an indirect electrical connection via one or more intervening devices and/or connections. Elements that are electrically connected with intervening wires or other conductors are considered to be coupled. Terms such as "top," "bottom," "front," "back," "over," "above," "under," "below," and such, may be used in this disclosure. These terms should not be construed as limiting the position or orientation of a structure or element but should be used to provide spatial relationship between structures or elements.

The term "semiconductor die" is used herein. A semiconductor device can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device may also be referred to herein as a semiconductor device or an integrated circuit (IC) die.

The term "semiconductor package" is used herein. A semiconductor package has at least one semiconductor die electrically coupled to terminals and has a package body that protects and covers the semiconductor die. In some arrangements, multiple semiconductor dies can be packaged together. For example, a power metal oxide semiconductor (MOS) field effect transistor (FET) semiconductor device and a second semiconductor device (such as a gate driver die, or a controller die) can be packaged together to from a single packaged electronic device. Additional components such as passive components, such as capacitors, resistors, and inductors or coils, can be included in the packaged electronic device. The semiconductor die is mounted with a package substrate that provides conductive leads. A portion of the conductive leads form the terminals for the packaged device. In wire bonded integrated circuit packages, bond wires couple conductive leads of a package substrate to bond pads on the semiconductor die. The semiconductor die can be mounted to the package substrate with a device side surface facing away from the substrate and a backside surface facing and mounted to a die pad of the package substrate. The semiconductor package can have a package body formed by a thermoset epoxy resin mold compound in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions form the terminals for the semiconductor package. The semiconductor package may also be referred to as a "integrated circuit package," a "microelectronic device package," or a "semiconductor device package."

The term "package substrate" is used herein. A package substrate is a substrate arranged to receive a semiconductor die and to support the semiconductor die in a completed semiconductor device package. Package substrates useful with the arrangements include conductive lead frames, which can be formed from copper, aluminum, stainless steel, steel, and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. In example arrangements, a heat slug is attached to the package substrate, and the heat slug has a die mounting area for mounting semiconductor devices. The lead frames can be provided in strips or arrays. The conductive lead frames can be provided as a panel with strips or arrays of unit device portions in rows and columns. Semiconductor dies can be placed on respective unit device portions within the strips or arrays. A semiconductor die can be placed on a die mount area for each packaged semiconductor die. Die attach or die adhesive can be used to mount the semiconductor dies. In wire bonded packages, bond wires can couple bond pads on the semiconductor dies to the leads of the lead frames. The lead frames may have plated portions in areas designated for wire bonding, for example silver, nickel, gold, or palladium plating can be used. After the bond wires are in place, a portion of the package substrate, the semiconductor die, and at least a portion of the die pad can be covered with a protective material such as a mold compound. More than one semiconductor die can be mounted to a package substrate for each unit.

The term "multilevel package substrate" is used herein. A multilevel package substrate is a substrate that has multiple conductor levels including conductive traces, and which has vertical conductive connections extending through the dielectric material between the conductor levels. In an example arrangement, a multilayer package substrate is formed by plating a patterned conductor level and then covering the conductor with a layer of dielectric material. Grinding can be performed on the dielectric material to expose portions of the layer of conductors. Additional plating layers can be formed to add additional levels of conductors, some of which are coupled to the prior layers by vertical connectors, and additional dielectric material can be deposited at each level and can cover the conductors. By using an additive or build up manufacturing approach, and by performing multiple plating steps, molding steps, and grinding steps, a multilayer package substrate is formed with an arbitrary number of layers. In an example arrangement, copper conductors are formed by plating, and a thermoplastic material can be used as the dielectric material.

In packaging microelectronic and semiconductor devices, a mold compound may be used to partially cover a package substrate, to cover components, to cover a semiconductor die, and to cover the electrical connections from the semiconductor die to the package substrate. This molding process can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed by pressing the liquid mold compound into a mold through runners or channels. Transfer molding can be used. Unit molds shaped to surround an individual device may be used, or block molding may be used, to form multiple packages simultaneously for several devices from mold compound. The devices to be molded can be provided in an array or matrix of several, hundreds or even thousands of devices in rows and columns that are then molded together.

After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

The term "quad flat no-lead" (QFN) is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as small outline no-lead or SON packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. Small outline no-lead (SON) packages can be used, and a small outline transistor (SOT) package is a leaded package that can be used with the arrangements. Leads for leaded packages are arranged for solder mounting to a board. The leads can be shaped to extend towards the board and form a mounting surface. Gull wing leads, J-leads, and other lead shapes can be used. In a DIP package, the leads end in pin shaped portions that can be inserted into conductive holes formed in a circuit board, and solder is used to couple the leads to the conductors within the holes.

The term "patch antenna" is used herein. A patch antenna is a planar conductor in a rectangular, square, circular, oval, triangular, or other geometrically shaped sheet or "patch" of material mounted over and spaced from a ground plane. In the arrangements, a patch antenna is formed of a first conductor layer in a multilayer substrate, and a ground reflector is formed of a lower layer of conductor in the multilayer substrate to reflect signals from the patch antenna back to the patch antenna. The patch antenna and the ground reflector are spaced by dielectric material of the package substrate. The term "E-patch antenna" is used herein. An E-patch antenna is a patch antenna with a central portion that is a rectangular or square shape, a first end portion that is a rectangular shape spaced from the central portion by a first slot, and a second end portion that is a rectangular shape spaced from the central portion by a second slot. The E-patch antenna pattern resembles a capital letter "E" when viewed from a top view.

The term "antenna horn" is used herein. An antenna horn is a flared metal waveguide shaped to direct radio waves. The antenna horn is typically positioned in alignment with a device that radiates radio waves, such as a patch antenna.

In the arrangements, a microelectronic device package includes a semiconductor die and an antenna horn mounted side-by-side on a multilayer package substrate. The multilayer package substrate has a device side surface, a semiconductor die mounted on a portion of the device side surface, and a patch antenna formed spaced from the die portion. An antenna horn is mounted to the device side surface above the patch antenna. In an example arrangement, the semiconductor die will be mounted beside, or side by side, with respect to a patch antenna formed on the device side surface. In the multilayer package substrate, the patch antenna can be formed in a conductive layer at or near the device side surface of the multilayer package substrate, for example as a patterned plated conductor layer of the multilayer package substrate. Another layer of the multilayer package substrate can have a reflector patterned in a conductor beneath the antenna pattern, to increase efficient transmission by the patch antenna by reflecting radiated energy back towards the patch antenna and away from the device side surface of the multilayer package substrate. Another layer of the multilayer package substrate can have a ground plane patterned in a conductor above or at the same level as the patch antenna pattern. An antenna horn is mounted on and electrically attached to the ground plane. A semiconductor die mounted to the device side surface of the multilayer package substrate can be coupled to the patch antenna by conductive traces formed in conductor layers of the multilayer package substrate. In one example, the semiconductor die is flip chip mounted to the multilayer package substrate. In an alternative example, a semiconductor die mounted facing away from the device side surface of the multilayer package substrate and is wire bonded to conductive traces on the multilayer package substrate.

Examples of a microelectronic device package having a semiconductor die mounted side-by-side on a multilayer package substrate and a patch antenna formed spaced from the die portion are disclosed in pending U.S. patent application Ser. No. 17/566,067, filed Dec. 30, 2021, the disclosure of which is hereby incorporated herein in its entirety.

In an example arrangement, a patch antenna with an antenna horn is configured to operate in the rectangular waveguide 5 (WR5) frequency range, between 140 GHz and 220 GHz. In other examples, the patch antenna can be configured to operate in the millimeter wave range between 30 GHz and 300 GHz, with signals having wavelengths in air between 10 millimeters (mm) and 1 mm. Other frequency signals, such as RF signals, can be transmitted or received by the antenna. In one example arrangement, the patch antenna is an E-patch antenna. In the arrangements, a planar layer of conductor in the multilayer package substrate is patterned to form a patch antenna and the corresponding feed line, and a planar reflector, spaced from the patch antenna by dielectric material, is formed to reflect radiated energy from the patch antenna back to the patch antenna, to increase the transmitted energy.

In one example, the antenna horn is formed by a metal stamping process. The antenna horn may be attached to the device side of the multilayer package substrate using solder. Alternatively, a mounting structure or insertion aid structure may be formed on a ground plane one the device side of the multilayer package substrate. The mounting structure may be adapted to receive the antenna horn to ensure positioning and alignment of the antenna horn. The interior of the antenna horn may be filled with the mold compound in some arrangements. In other arrangements, the antenna horn is air filled and the mold compound does not flow into the antenna horn.

The semiconductor die used in the arrangements can be a monolithic millimeter wave integrated circuit (MMIC). The MMIC can be a transmitter, receiver, transceiver, or a component in a system for transmitting or receiving signals such as an amplifier, encoder, filter, or decoder. The semiconductor die can be provided as multiple semiconductor dies or as components mounted to the multilayer package substrate, to form a system. Additional passive components can be mounted to the multilayer package substrate.

FIGS. 1A-1F illustrate example configurations of a microelectronic device package 100. FIG. 1A illustrates the microelectronic device package 100 in an isometric view. FIG. 1B illustrates the microelectronic device package 100 in a plan or top view. FIG. 1C illustrates the microelectronic device package 100 in a cross-sectional view. The illustrated arrangement uses a quad flat no lead (QFN) package. QFN packages are one type of package that is useful with the arrangements. Other package types, including leaded and other no lead packages, can be used. The microelectronic device package 100 includes a multilayer package substrate 101.

A number of terminals 102 are formed of a conductor material on a board side surface 103 (i.e., the bottom surface as the arrangement is oriented in FIG. 1A) of the multilayer package substrate 101. The dielectric material of the multilayer package substrate 101 can be a thermoplastic or a thermoset material. An example thermoplastic material is ABS (Acrylonitrile Butadiene Styrene). Alternative dielectric materials include thermoplastics such as ASA (Acrylonitrile Styrene Acrylate), thermoset mold compound including epoxy resin, epoxies, resins, or plastics.

Vertical connectors 104 (shown in FIG. 1C) extend from terminals 102 through layers of dielectric material of the multilayer package substrate 101 to a device side surface 105 of the multilayer package substrate 101. A number of leads 106 are formed of a conductive material on the device side surface 105 of the multilayer package substrate 101. A semiconductor die 107 is mounted to the multilayer package substrate 101. The semiconductor die 107 in the illustrated example is flip chip mounted, so that an active surface 108 of the semiconductor die 107 is oriented facing the device side surface 105 of the multilayer package substrate 101. Conductive post connects 109 extend from the semiconductor die 107 to leads 106 and make electrical connections between semiconductor die 107 and multilayer package substrate 101. An underfill material, such as a resin or epoxy, or a glob top mold compound applied as a gel or liquid, can be flowed beneath the semiconductor die 107, after mounting the semiconductor die 107, to protect the post connects 109 and solder connections to leads 106.

In the examples, a semiconductor device 107 is mounted to a device side surface 105 of a multilayer package substrate 101. In forming the microelectronic device package 100, the semiconductor devices 107 can be formed independently of the multilayer package substrate, so that methods for forming the semiconductor device 107, and the multilayer package substrate 101, can be performed at different times, and at different locations, then the components can be assembled together to complete the microelectronic device package 100.

As illustrated in FIG. 1C, a patch antenna 110 is a planar or microstrip antenna formed of a conductor layer within the multilayer package substrate 101. The patch antenna 110 is coupled to a transmission line 111, which is coupled to the semiconductor die 107 by a vertical connector 112 within multilayer package substrate 101 and a conductive post 113. Transmission line 111 may function as a coplanar waveguide feed in one example. Although a patch antenna is described herein as the source of radiation for an antenna horn, in other arrangements other radiating structures may be used.

A first ground layer or reflector 114 is formed in a lower conductor layer of the multilayer package substrate 101. The reflector 114 is positioned beneath and aligned with the antenna 110. The conductor layer for reflector 114 is formed closer to or at the board side surface 103 of the multilayer package substrate 101. The reflector 114 is aligned with and spaced from the antenna 110 by dielectric material in the multilayer package substrate 101. Vias 115 extend from a feed portion of the patch antenna 110 to the reflector 114, which can be at ground.

A second ground layer 116 is formed on the device side surface 105 of multilayer package substrate 101. Second ground layer 116 is formed generally above and around the antenna 110 with a hole 117 positioned directly above the antenna 110. Hole 117 is configured to allow radio frequency (RF) energy to pass from the antenna 110 and then into and through a horn 118. Horn 118 may be made of a metal, such as copper, and is attached to the device side surface 105 such as by soldering the horn 118 to the second ground layer 116.

As illustrated in FIGS. 1A and 1C, a mold compound or other protective material 119 is shown overlying the device side surface 105, the second ground layer 116, and the semiconductor device 107. Mold compound 119 surrounds and fills horn 118. In the arrangement illustrated in FIGS. 1A-1C, patch antenna 110 is covered by the mold compound 119, and signals radiated from or received by the antenna 110 traverse the mold compound 119. In an alternative arrangement, the mold compound 119 only surrounds the horn 118 and an interior region 120 of horn 119 is left open and not filled with the mold compound 119. Mold compound 119 can be a thermoset mold compound of epoxy resin, another epoxy, a resin, or a plastic.

Terminals 102 on the board side surface 103 are configured for mounting to a system board, for example a printed circuit board. Leads 106 are formed on the device side surface 105 of the multilayer package substrate 101 can be formed of the same material as patch antenna 110, for example, copper, gold, aluminum, silver, or an alloy of these. Protective plating layers such as palladium, nickel, gold, or multiple layers of these can be formed on the device side surface 105 of the multilayer package substrate 101.

The semiconductor die 107 is shown mounted on the device side surface 105 of the multilayer package substrate 101 in a side-by-side orientation with respect to the antenna 110. Although not shown in the illustration for simplicity of explanation, additional components such as passives or additional semiconductor devices can be mounted to the device side surface 105 of the multilayer package substrate 101. Leads 106 are formed on the device side surface of the multilayer package substrate 101 and couple the semiconductor die 107 to vertical connectors 104, which are conductors formed of the intervening conductive layers of the multilayer package substrate 101 that extend through dielectric material to the terminals 102.

FIG. 1D is a cross-sectional view illustrating an alternative configuration of a microelectronic device package 130. In microelectronic device package 130 the patch antenna 120 is formed in a conductor layer on the device side surface 105 of multilayer package substrate 101 instead of in an intermediate conductor layer as shown in FIG. 1C. Patch antenna 121 is coupled to transmission line 111 via conductive via 122 through the dielectric material of multilayer package substrate 101. In an alternative arrangement of the configuration shown in FIG. 1D, the mold compound 119 is not provided within interior region 120 of horn 119, so that a surface of the E-patch antenna 121 is exposed to air. In this arrangement, signals radiated from the E-patch antenna 121 do not traverse the mold compound 119 or the dielectric layers of multilayer package substrate 101 and are instead transmitted directly to the air.

The arrangements shown in FIGS. 1A-D can be formed using additive manufacturing, or build up processing, to form the multilayer package substrate including the patch antenna, the reflector, and ground layer. As is further described herein, by using a series of plating, molding, and grinding steps, successive layers of trace level conductors, vertical connections, and dielectric can be formed, and these steps can be repeated to form a multilayer package substrate. The E-patch antenna can be formed by forming a pattern on a rectangular portion of the desired conductor layer, which may be a first or top conductor layer or an intermediate layer. Because the vertical connections are formed using an additive process, and then dielectric material is molded over the vertical connections, the need for drilling precise via holes, and the need to plate or fill the via holes with conductors, is eliminated, so the multilayer package substrate is cost effective when compared to organic substrates such as printed circuit boards. By mounting the semiconductor die on the multilayer package substrate in a position spaced from and coupled to the patch antenna using existing flip chip or wire bonding connections, a reliable and cost-effective microelectronic device package including an antenna is provided by use of the arrangements. While an E-patch antenna is shown as the illustrated example, other patch antenna shapes can be used to from alternative arrangements.

FIG. 1C illustrates a spacing distance labeled Drefl between the patch antenna 110 and the reflector 114. In the arrangements, the patch antenna 110 is configured to radiate signals upwards away from the device side surface 105 of the multilayer package substrate 101. When energy is applied to the patch antenna 110, the energy radiates in all directions, including through the multilayer substrate 101 towards the reflector 114. Because as the signal energy travels, the phase shifts, and because the reflector 114 will cause a $\lambda/2$ phase shift, where $\lambda$ is the wavelength of the signal in the dielectric material, the distance Drefl can be adjusted to be approximately $\lambda/4$, so that the energy transmitted to the reflector, reflected by the reflector, and returned to the antenna 110 traverses a phase shift of $\lambda/4+\lambda/2+\lambda/4$, or $\lambda$. The reflected energy from reflector 114 arrives at the patch antenna 110 in phase with the energy being transmitted upwards from the patch antenna 110, adding to the gain of the signal using of constructive interference. By using different layers of the multilayer package substrate 101 to form the reflector 114, the distance Drefl can be altered so as to increase the efficiency of the patch antenna 110 and reflector 114. This same alteration can be used to optimize the distance between ground 116 and antenna 110 and/or the between ground 116 and reflector 114 to achieve a desired phase shift. The thickness of the multilayer package substrate 101 can be varied to vary the distance Drefl. Note that the wavelength $\lambda$ in the multilayer package substrate differs from the wavelength in air, because it depends on the dielectric constant of the material the signal is traversing. Simulation of the signal propagation in the selected dielectric material can be used to determine the proper spacing distance Drefl to get the phase shift of $\lambda/4$.

FIG. 2 illustrates, in plan view, an example E-patch antenna 200 for use in some arrangements. E-patch antenna 200 may be formed in a conductor layer, for example, a copper, aluminum, or gold layer can be used. The conductor layer can be formed as a layer on or in a multilayer package substrate as illustrated herein. E-patch antenna 200 has two rectangular end portions 201, 202 that are spaced from a central portion 203 by two slots 204, 205. The E-patch antenna 200 is a patterned conductor material that is coupled to a feed input 206, such as transmission line 111 (FIGS. 1A-D). Feed input 206 may be formed in the same conductor layer as antenna 200. E-patch antenna arrangement 200 may be configured for radiating signals in the 30 GHz and 300 GHz frequency range (millimeter wave range) or in other radio frequency ranges. In an alternative arrangement, additional patch antenna shapes can be used. For example, rectangular, circular, triangular, oval, and other shapes can be used as the patch antenna in microelectronic device packages 100 or 130. The patch antenna 200 can be formed on a first conductor layer on the device side of a multilayer package substrate. Alternatively, the patch antenna 200 may be formed in a conductor layer buried within the multilayer package substrate. Patch antenna 110 can be formed of conductive material such as copper, gold, or alloys. Other conductive materials that are compatible with plating processes can also be used, including silver and aluminum.

In an example arrangement, patch antenna 200 may have two parasitic antennas 207, 208 that are alongside the ends of the E-patch pattern. These parasitic antennas 207, 208 are optional and can be larger, smaller, and spaced at varying distances from the E-patch antenna to tune the antenna response as desired. Simulations can be performed to determine the size and placement of the parasitic antennas 207, 208 for a particular application.

The dimensions of E-patch antenna 200 can be varied with application and can be determined in a simulation of the antenna design. Useful sizes for an example of a multilayer package substrate could be from 2 to 7 millimeters by 2 to 7 millimeters, for example. The size of the multilayer package substrate can be varied depending on the size and number of semiconductor devices mounted, as well as the patch antenna dimensions, so that the area of the device side surface is sufficient for mounting the semiconductor devices and the antenna spaced from the semiconductor devices. As frequencies increase, the wavelengths become compatible with microelectronics package sizes, for example millimeter wave signals between 30 and 300 GHz have wavelengths of between 10 and 1 millimeters. The patch antennas of the arrangements take advantage of these sizes. As the transmit and receive frequencies increase and wavelengths correspondingly decrease, the size of the patch antenna may decrease, and the useful sizes of the multilayer package substrate may also decrease. The arrangements are useful in implementing antennas with millimeter wave frequencies and 5G standard frequencies, for example.

A reflector 209 is formed in a conductor layer of the multilayer package substrate that is set below the conductor layer used to form the patch antenna 200. Additionally, a ground layer (not shown in FIG. 2) is formed on the device side of the multilayer package substrate. The ground layer is configured to provide a base on which a horn can be attached, such as horn 118 mounted on ground layer 116 in FIGS. 1A-D. The reflector 209, ground layer, and antenna 200 may be formed of the same material or different conductor materials. For example, reflector 209 and ground layer can be formed of copper or gold.

FIG. 3 illustrates in a cross sectional view a multilayer package substrate 300 that can be used with the example arrangements disclosed herein. The multilayer package substrate 300 has a device side surface 301 and a board side surface 302. Three trace layers 303, 304, 305 are formed spaced from one another by dielectric material 306. The trace layers 303, 304, 305 are patterned for making horizontal connections. Three vertical conductor layers 307, 308, 309 form electrical connections between the three trace layers 303, 304, 305. Vertical conductor layers 307, 308, 309 extend through the dielectric material 306 that is disposed over and between the trace layers 303, 304, 305. The dielectric material 306 can be a thermoplastic material, such as ABS or ASA, or can be a thermoset material, such as epoxy resin mold compound. While the illustrated example shows three trace layers and three vertical conductor layers, in other examples and arrangements any number of trace layers and vertical conductor layers may be used by forming additional layers as described herein.

In one example, multilayer package substrate 300 has a substrate thickness labeled "TS" of 200 microns. The first trace layer 303 is near the device side surface 301 of the multilayer package substrate 300 and has a trace layer thickness TL1 of 15 microns. The first vertical conductor layer 307 has a thickness VC1 of 50 microns. The second trace layer 304 is sometimes coupled to the first trace layer 303 by the first vertical connection layer 306 and has a thickness labeled TL2 of 15 microns. The second vertical connection layer 308 has a thickness labeled VC2 of 85 microns. The third trace layer 305 has a thickness labeled TL3 of 15 microns. The third vertical connection layer 309 has a thickness labeled VC3 of 20 microns. A continuous vertical connection between the device side surface 301 and the board side surface 302 can be formed by patterning a stack of trace layers and the corresponding vertical connection layers to form a continuous conductive path extending through the dielectric material 306. Additional layers, such as conductive lands on the device side surface 301 or terminals on the board side surface 302, may be formed by plating (not shown in FIG. 3).

In an example of multilayer package substrate 300, an antenna can be formed by patterning the second trace layer 304, while a reflector can be formed by patterning the third trace layer 305 and a ground plane formed by patterning the first trace layer 303. In another example, an antenna can be formed on surface 301 of multilayer package substrate 300 by patterning the first trace layer 303, while a reflector is formed by patterning the third trace layer 305 and a ground plane formed by patterning an area on the first trace layer 303 that surrounds the antenna.

An antenna horn, such as horn 118 (FIG. 1A), may be attached to the device side surface 301 such as by soldering the antenna horn to a patterned area on first trace layer 303. In an alternative example, an elevated trace 310 may be patterned on the device side surface 301. For example, elevated trace 310 may be patterned to function as an insertion aid for an antenna horn to ensure a secure physical and electrical attachment between the antenna horn and the multilayer package substrate 300. Elevated trace 310 may be a conductive material, such as copper, that is electrically coupled to first trace layer 303. The elevated trace 310 and the first trace layer may be the same or different materials. In one example, the elevated trace has a thickness ET of 60 microns.

A semiconductor device mounting area positioned spaced from the antenna, as described above, can be formed by patterning the first trace layer 303. Note that in this description, the vertical connection layers 307, 308, and 309 are not described as "vias" to distinguish the vertical connections of the arrangements from the vertical connections of PCBs or other circuit board substrates, which are filled via holes. The vertical connections of the arrangements are formed using additive manufacturing, while vias in PCBs are usually formed by removing material, for example via holes are drilled into the substrate. These via holes between conductor layers then must be plated and then filled with a conductor, which requires additional plating steps after the drilling steps. These additional steps are precise manufacturing processes that add costs and require additional manufacturing tools and capabilities. In contrast the vertical connection layers used in the multilayer package substrates of the arrangements herein are formed in the same plating processes as forming the trace layers, simplifying manufacture, and reducing costs. In addition, the vertical connection layers in the arrangements can be arbitrary shapes, such as rails, columns, or posts, and the rails can be formed in continuous patterns to form electric shields, tubs, or tanks, and can be coupled to grounds or other potentials, isolating regions of the multilayer package substrate from one another. Noise reduction and the ability to create electrically isolated portions of the multilayer package substrate can be enhanced by use of the vertical connections to form tanks, shields, and tubs. Thermal performance of the microelectronic device packages of example arrangements can be improved by use of the vertical connection layers to form thermally conductive columns, sinks or rails that can be coupled to thermal paths on a system board to increase thermal dissipation from the semiconductor devices mounted on the multilayer package substrate.

FIGS. 4A-4B illustrate, in a series of cross-sectional views, selected steps for a method for forming a multilayer package substrate that is useful for example semiconductor packages. In FIG. 4A, at step 401, a metal carrier 471 is readied for a plating process. The metal carrier 471 may be stainless steel, steel, aluminum, or another metal that will support the multilayer package substrate layers during plating and molding steps. After use in the illustrated process and a multilayer package substrate is then removed, the metal carrier 471 may be cleaned for use in additional manufacturing processes.

At step 403, a first trace layer 451 is formed by plating. In an example process, a seed layer is deposited over the surface of the metal carrier 471 by sputtering, chemical vapor deposition (CVD), or other deposition step. A photoresist layer is deposited over the seed layer, exposed, developed, and cured to form a pattern to be plated. Electroless or electroplating may be performed using the exposed portions of the seed layer to start the plating. The pattern is formed according to patterns in the photoresist layer.

At step 405, the plating process continues. A second photoresist layer is deposited, exposed, and developed to pattern a first vertical connection layer 452. By leaving the first photoresist layer in place, the second photoresist layer can be used without an intervening strip and clean step, which simplifies processing. The first trace layer 451 can be used as a seed layer for the second plating operation to further simplify processing.

At step 407, a first molding operation is performed. The first trace layer 451 and the first vertical connection layer 452 are covered in a dielectric material. In one example, a thermoplastic material is used. In particular examples ABS or ASA can be used. Alternatively, a thermoset epoxy resin mold compound, or resins, epoxies, or plastics can be used. In an example compressive molding operation, a mold compound can be heated to a liquid state, forced under pressure through runners into a mold to cover the first trace layer 451 and the first vertical connection layer 452, and subsequently cured to form solid mold compound layer 461.

At step 409, a grinding operation performed on the surface 462 of the mold compound 461 exposes a surface of the vertical connection layer 452 and provides conductive surfaces 463 for mounting devices or for use in additional plating operations. If the multilayer package substrate is complete, the method ends at step 410, where a de-carrier operation removes the metal carrier 471 from the dielectric material 461, leaving the first trace layer 451 and the first vertical connection layer 452 in a dielectric material 461, thereby providing a package substrate.

In examples where additional trace layers and additional vertical connection layers are needed, the method continues after leaving step 409 and transitioning to step 411 in FIG. 4B.

At step 411, a second trace layer 453 is formed by plating using the same processes as described above with respect to step 405. A seed layer for the plating operation is deposited and a photoresist layer is deposited and patterned. The plating operation forms the second trace layer 453 over the mold compound 461, with portions of the second trace layer 453 electrically connected to the first vertical connection layer 452.

At step 413, a second vertical connection layer 454 is formed using an additional plating step on the second trace layer 453. The second vertical connection layer 454 can be plated using the second trace layer 453 as a seed layer, and without the need for removing the preceding photoresist layer, thereby simplifying the process.

At step 415, a second molding operation is performed to cover the second trace layer 453 and the second vertical connection layer 454 in a layer of dielectric material 464. The multilayer package substrate at this stage has a first trace layer 451, a first vertical connection layer 452, a second trace layer 453, and a second vertical connection layer 454. Portions of the layers are electrically connected together to form vertical paths through the mold compound layers 461 and 464.

At step 417, the mold compound layer 464 is mechanically ground in a grinding process or chemically etched to expose a surface 465 of the second vertical connection layer 454.

At step 419 the example method ends by removing the metal carrier 471, leaving a multilayer package substrate including the conductor layers 451, 452, 453 and 454 in dielectric layers 461, 464. The steps of FIGS. 4A-4B can be repeated to form multilayer package substrates for use with the arrangements having more layers, such as to create three or more conductive trace layers, by repeatedly performing plating of a trace layer, plating of a vertical connection layer, molding, and grinding.

FIGS. 5A and 5B illustrate top and bottom isometric views, respectively, of an antenna horn 500 according to one example. Antenna horn 500 may be manufactured using a metal stamping process, for example. Antenna horn 500 may be created from a metal sheet, such as a copper, gold, silver, or other alloy sheet. Antenna horn 500 has a waveguide section 501 and a flared section 502. The waveguide section 501 has a constant length and width. The flared section 502 starts at a narrow end with the same dimensions as the waveguide section 501 and then expands in both length and width as the flared section 501 extends away from the waveguide section 501. In one arrangement, the waveguide section 501 has an outside width WW of 0.54 mm and an outside length WL of 1.07 mm. The far end of the flared section 502 has an outside width FW of 1.78 mm and an outside length FL of 2.42 mm. The waveguide section 501 has a height WH of 0.45 mm, and the flared section has a height FH of 0.88 mm, which makes the overall height of the antenna horn 500 to be 1.03 mm. The thickness of antenna horn 500 may consistent across the height of the waveguide and flared sections or one section may be thicker than the other, such as due to the manufacturing method wherein the flared section 502 may be thinner than waveguide section 501. In one example, the thickness WT of the waveguide section is 100 microns, and the thickness FT of the flared section is 50 microns.

Antenna horn 500 may be mounted on a multilayer package substrate 101 as illustrated in FIGS. 1A-D. Antenna horn 500 may be positioned aligned above a patch antenna 110 or 121 in a configuration that directs RF radiation through antenna horn 500. Antenna horn 500 may be mounted on the multilayer package substrate 101 by soldering feed end 503 of the antenna horn 500 to the ground trace layer 116.

FIGS. 6A-6C illustrate, in an isometric view, a plan view, and a cross-sectional view, respectively, an example arrangement in which an insertion aid structure 600 is incorporated on to a multilayer package substrate for attachment of the antenna horn. Insertion aid structure 600 provides a mounting structure for an antenna horn. Referring to common elements illustrated in in FIGS. 1A-C, FIG. 6A illustrates a reflector 114 formed in a lower conductor layer of the multilayer package substrate. A stripline or feed line 111 is formed in a conductor layer above the reflector 114. The feed line 111 is coupled to a vertical connector 112 and a conductive post 113, which provide an electrical connection through the multilayer package substrate between an antenna (e.g., antenna 110 or 121) and a semiconductor die (e.g., semiconductor die 107).

A ground layer 601 is formed on the device side surface of the multilayer package substrate. In one arrangement, the ground layer 601 is formed in a conductive layer above feed line 111 and the antenna, and an opening 602 (such as hole 117) allows radiation to pass from the antenna. In another arrangement, the antenna is formed in the same conductive layer as ground layer 601, and the hole 602 surrounds the antenna. Two elevated traces 603 and 604 are built up on ground layer 601 such as by a plating process described with respect to FIG. 3. Trace 603 forms an outer ring, and trace 604 forms an inner ring. Together elevated traces 603, 604 create an insertion slot 605 between them. Elevated trace 310 may be a conductive material, such as copper, that is electrically coupled to ground trace layer 602.

In one example, the outer ring trace 603 has a thickness OT of 100 microns, and the inner ring trace 604 has a thickness IT of 50 microns. The elevated traces 603 and 604 may have a trace height TH of 60 microns. In other arrangements, the thickness of the outer ring trace 603 and the inner ring trace 604 may be wider or narrower than described herein, and the height of the traces 603, 604 may be higher or lower than 60 microns. The parameters of the elevated traces 603, 604 may be selected, for example, based upon the size of the antenna horn to be mounted or any other feature of the multilayer package substrate or intended application of the final package. In some examples, the thickness of the elevated traces 603, 604 and the insertion slot 605 are not consistent on all sides. For example, the thickness of length portions 603*a*, 604*a*, 605*a* may be wider or narrower than the thickness of width portions 603*b*, 604*b*, 605*b*.

FIG. 6D illustrates, in an isometric view, an antenna horn 606 installed on the ground layer 601 of a multilayer package substrate using the insertion aid structure 600. As shown in the arrangement of FIG. 6D, insertion aid structure 600 ensures proper placement and alignment of the antenna horn 606 relative to opening 602 and the antenna (not shown). Antenna horn 60 may be attached to the insertion aid structure 600 and held in place by friction, such as by clamping the walls of the waveguide section 607 of antenna horn 606 into the insertion slot 605 between the elevated traces 603, 604 (e.g., "snapping" the walls of the antenna horn 606 into place in slot 605). Alternatively, antenna horn 606 may be fixedly attached to insertion aid structure 600 by solder, epoxy, or other material. The term "ring" is used to describe the shape of elevated traces 603, 604, which may be a circular, oval, rectangular, or other shape as required to conform to the shape of the waveguide section 607 of antenna horn 606.

In another arrangement, insertion aid structure 600 may comprise a single elevated trace 603 or 604 that is used to locate a desired position for an antenna horn 606. For example, a single elevated trace 603 may be provided to encircle an outer surface of the walls of the waveguide section 607 of antenna horn 606. For example, a single elevated trace 604 may be provided to fit within the walls of the waveguide section 607 of antenna horn 606.

FIG. 6E illustrates a further arrangement of an insertion aid structure 610 the ground layer 601 of a multilayer package substrate. In FIG. 6E, an insertion slot (designated by dashed line 615) is formed between intermittent elevated traces 613, 614 consisting of a plurality of segments 613*a*, 614*a*. An outer ring 613 is a segmented or dashed line formed by segments 613, and an inner ring 614 is a segmented or dashed line formed by segments 614*a*. The walls of a waveguide section 607 on antenna horn 606 are positioned between the elevated trace segments 613*a*, 614*a*, which hold the antenna horn in a desired location on the multilayer package substrate.

In one arrangement, antenna horn 606 is manufactured by a metal stamping process and has dimensions similar to antenna horn 500 (FIGS. 5A-B). In other examples, antenna horn 606 may have any appropriate dimensions that are compatible with the configuration of insertion aid structure 600 and that are adapted for a desired RF spectrum and radiation pattern.

Figure 7A:
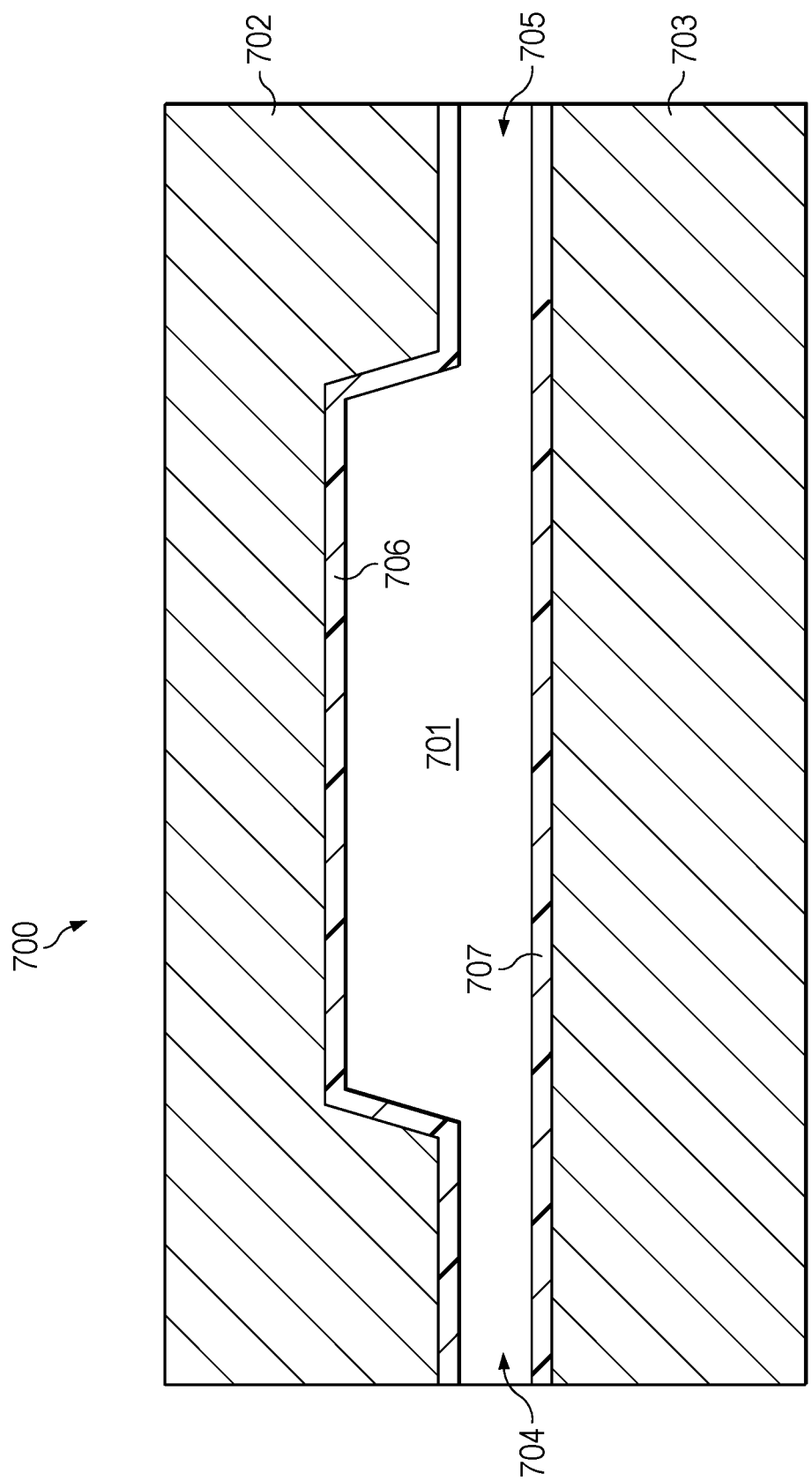

FIGS. 7A-D illustrate, in a series of cross-sectional views, selected steps for a semiconductor package molding process. FIG. 7A is a schematic cross section in part illustrating a side view of one configuration of mold system components. The mold system may include a mold 700 having a mold cavity 701. Mold 700 may include a first chase 702 and a second chase 703 that cooperate to form a system of passages and cavities between the chases. The chases 702, 703 form an input passage 704 that is configured to allow a molding material to enter the mold cavity 702. The chases 702, 703 also form an output passage 705 that is configured to evacuate air and excess molding material from the mold cavity 702. The molding processes may incorporate layers of release film 706, 707 that are vacuum formed to the surface of each chase 702, 703 along the mold cavity 701. When first chase 702 and second chase 703 are assembled to form mold 700, each layer of the release film 706, 707 is compressed and forms a seal surrounding mold cavity 701.

Figure 7B:
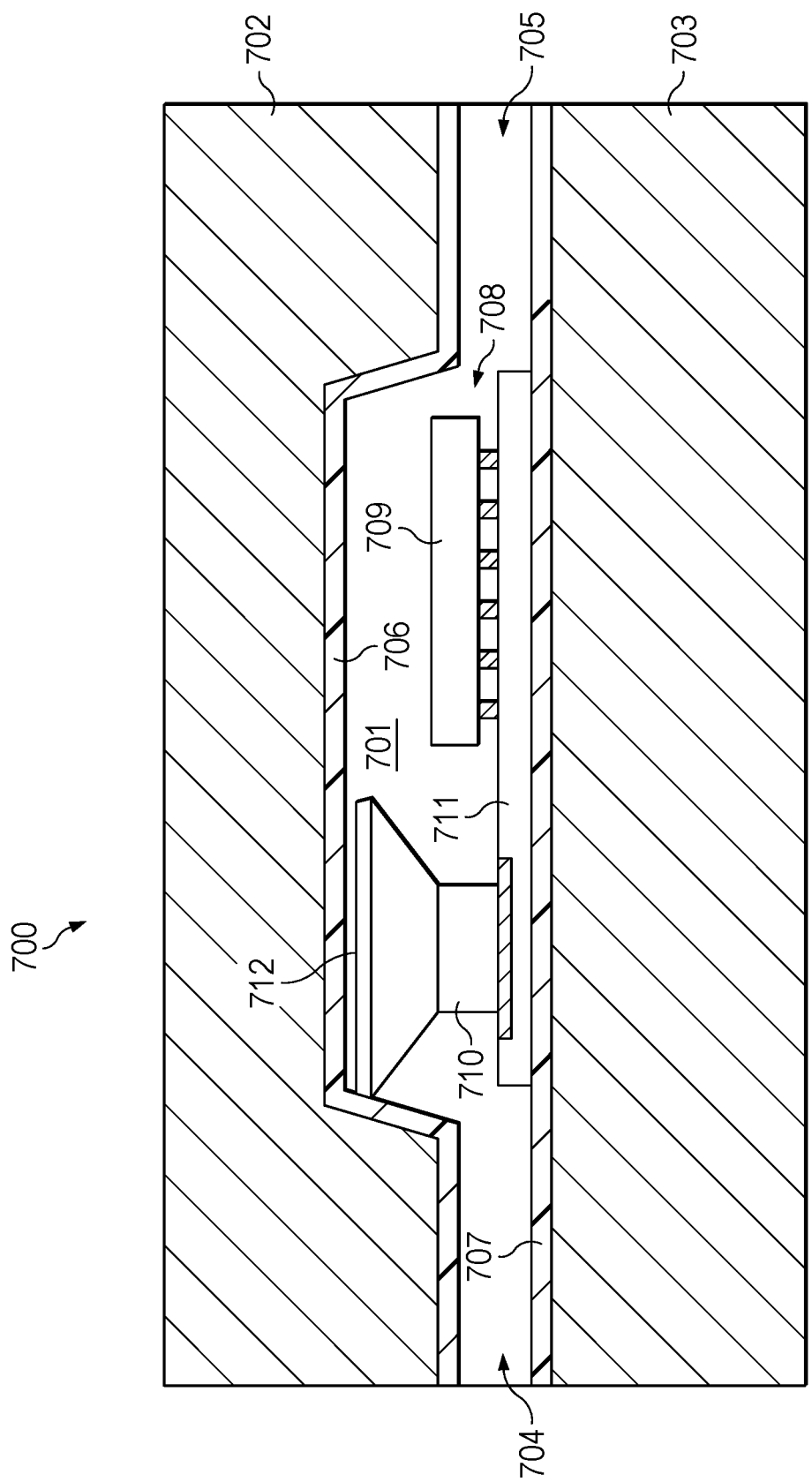

FIG. 7B illustrates an example arrangement in which a semiconductor device 708 has been positioned in mold cavity 701. For example, chase 702 may be opened or otherwise separated from chase 703 to create room for semiconductor device 708 to be loaded into mold cavity 701. Semiconductor device 708 may include a semiconductor die 709 and antenna horn 710 that are mounted on a multilayer substrate 711. Chases 702, 703 are then clamped together to seal semiconductor device 708 within cavity 701. Chase 702 is moved against an open end 712 of antenna horn 710 on semiconductor device 708. Release film 706 is sealed against open end 712, and release film 707 may be sealed against a bottom side of multilayer substrate 711. Output passage 705 may be used to evacuate air from mold cavity 701 to ensure that the release films 706, 707 are compressed against open end 712 and the bottom side of substrate 711.

Figure 7C:
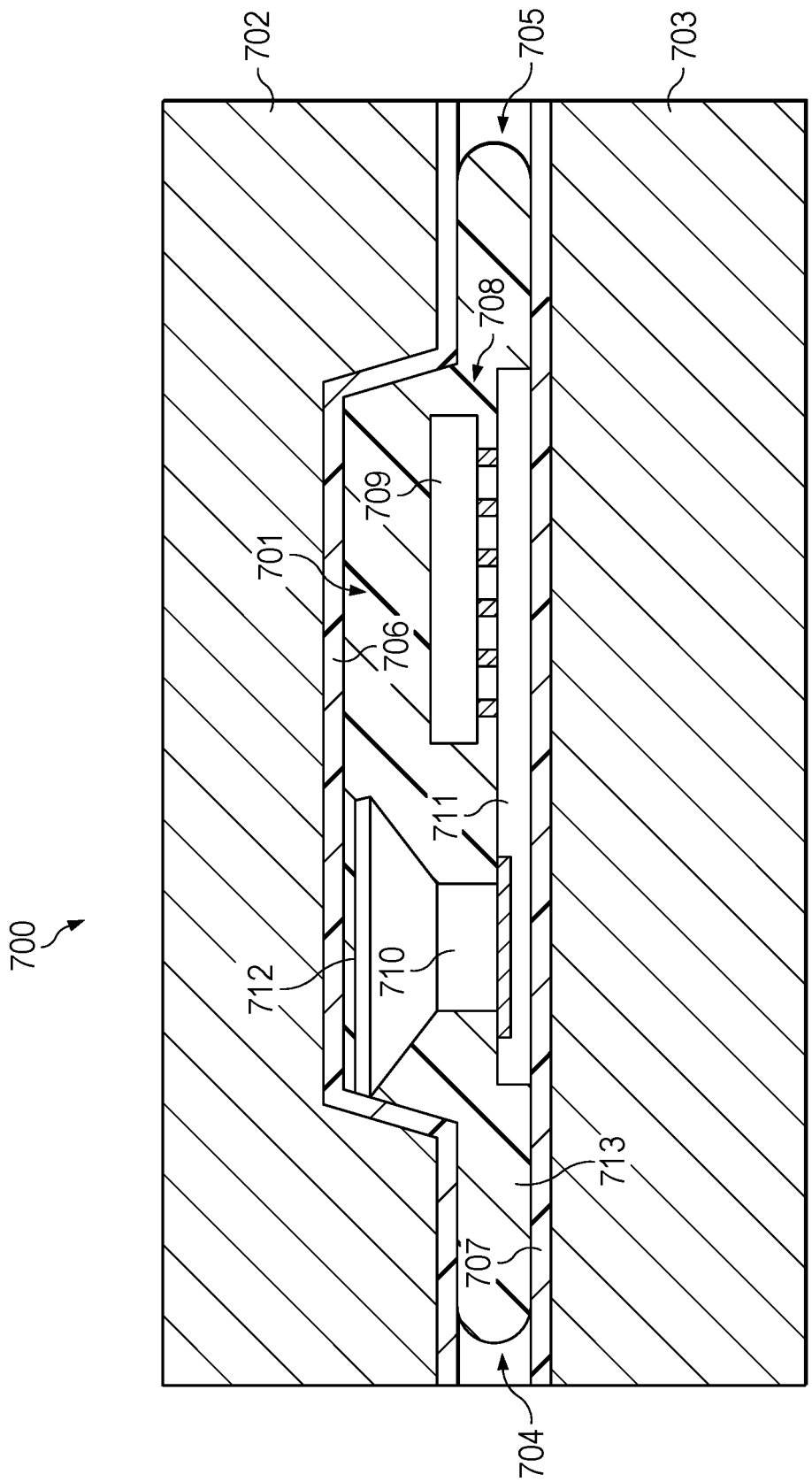

FIG. 7C illustrates a mold compound 713 being injected into mold cavity 701 through input passage 704. If a vacuum has not already been created within mold cavity 701, then the mold compound 713 replaces air within mold cavity 701 and forces air out of output passage 705. Mold compound 713 surrounds and encapsulates semiconductor device 708 including semiconductor die 709, antenna horn 710, and multilayer substrate 711. However, release film 706, which is sealed against open end 709 of antenna horn 710, prevents mold compound 713 from entering the hollow interior of antenna horn 710.

Mold material 713 may be any type of plastic or polymer, such as thermosetting plastics or thermoplastics. Prior to the molding process, molding material 60 may be in the form of powder, cold compacted powder in the form of pellets or preforms, or granules. Molding material 713 may also be a low viscosity molding material. Low viscosity molding materials 713 may include liquid, putty, or other materials that have a low viscosity during the molding process.

Figure 7D:
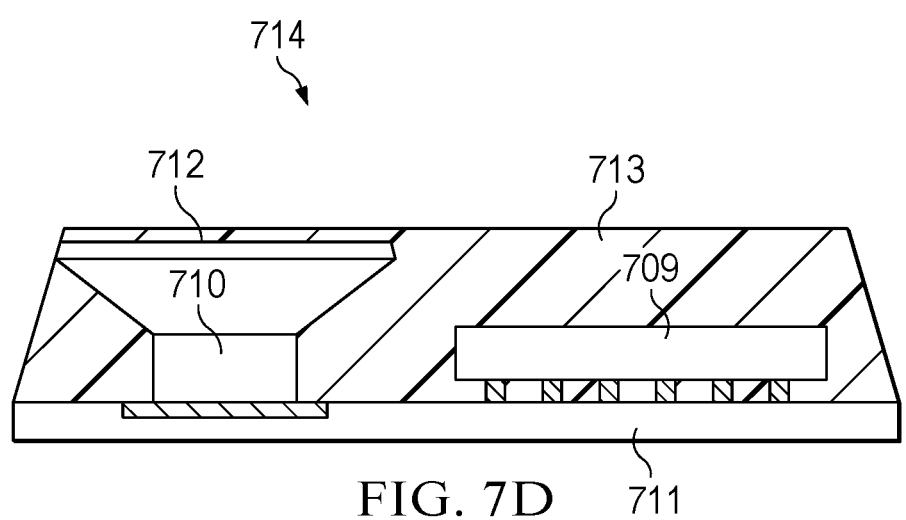

FIG. 7D illustrates a packaged semiconductor device 714 after the mold compound 713 has cured and the molding process is complete. Chases 702, 703 are separated and release films 706, 707 are removed. The including semiconductor die 709, antenna horn 710, and multilayer substrate 711 are covered by and surrounded by mold compound 713, but the interior of antenna horn is free of the mold compound 713.

In some configurations, an air-filled horn 710 may be desired for best antenna performance. For those configurations, the process illustrated in FIGS. 7A-D using a film-assisted molding process will provide an air-filled horn 710. In other configurations, a fully molded semiconductor package 714 may be desired with a mold-filled horn 710, such as to provide for improved mechanical integrity of the package 714. In those configurations, the process illustrated in FIGS. 7A-D may be used without release film 706 covering open end 712 of horn 710 and/or with a chase 702 modified to allow mold compound 713 to enter the interior of horn 710.

Semiconductor packages, such as package 714, may be used in mmWave and radar devices, for example. In those devices, the structures described herein, such as the insertion aid structure having an elevated trace and/or an air-filled antenna horn may be identified by x-ray and cross-section inspection. Such devices with an antenna horn on package with a multilevel substrate provide performance advantages such as no resonance elements, wide bandwidth, good directivity, etc.

In one example, a method comprises forming a patch antenna in a first conductor layer on or below a device side surface of a multilayer package substrate. The multilayer package substrate comprises conductor layers spaced from one another by dielectric material and vertical connection layers extending through the dielectric material between the conductor layers and coupling portions of the conductor layers to one another. The multilayer package substrate has a board side surface opposite the device side surface. The method further comprises forming a reflector in a second conductor layer of the multilayer package substrate. The reflector is aligned with and spaced from the patch antenna by the dielectric material. The second conductor layer is spaced apart from the patch antenna toward the board side surface. The method further comprises mounting a semiconductor die on the device side surface of the multilayer package substrate. The semiconductor die is coupled to the patch antenna. The method further comprises mounting an antenna horn on the device side surface. The antenna horn aligned with the patch antenna. In one arrangement, the antenna horn is mounted using a mounting structure on the device side surface.

The method may further comprise forming a ground plane in a conductor layer on the device side surface. The antenna horn may be mounted on the ground plane.

The method may further comprise covering the semiconductor die and a portion of the device side surface of the multilayer package substrate with a mold compound. The mold compound surrounds the antenna horn. In some arrangements, the mold compound fills an interior of the antenna horn. In other arrangements, the mold compound does not cover or fill an interior of the antenna horn and the antenna horn is air filled.

The patch antenna may be patterned as an E-patch antenna in a rectangular portion of the first conductor layer. The E-patch antenna comprises a central portion that is a rectangular shape, a first end portion that is a rectangular shape that is spaced from the central portion by a first slot, the first end portion coupled to the central portion by the first conductor layer, and a second end portion that is a rectangular shape that is spaced from the central portion by a second slot, the second end portion coupled to the central portion by the first conductor layer. The E-patch antenna may be configured to radiate signals at frequencies between 30 GHz and 300 GHz. A feed input for the E-patch antenna may be formed comprising a line in the first conductor layer coupled to the central portion.

The conductor layer may comprise copper, gold silver, aluminum, or an alloy of these. The multilayer package substrate may comprise dielectric material that is acrylonitrile butadiene styrene (ABS), acrylonitrile styrene acrylate (ASA) or epoxy resin mold compound.

In some arrangements, a microelectronic device package has a semiconductor die that is flip-chip mounted to the device side surface of a multilayer package substrate. In another arrangement, a wire bonded semiconductor die is mounted on the device side surface of the multilayer package substrate. The multilayer package substrate has an antenna formed on or below the device side surface and spaced from a semiconductor device mounting portion where the semiconductor die is attached. A die attach material may be used to mount the semiconductor die in a face up orientation with bond pads facing away from the multilayer package substrate. The semiconductor die may be coupled to the multilayer package substrate and the antenna using wire bonds. A mold compound is formed over the wire bonds and the semiconductor die. The mold compound may cover the antenna and other features, such as an antenna horn.

While various examples of the present disclosure have been described above, it should be understood that they have been presented by way of example only and not limitation. Numerous changes to the disclosed examples can be made in accordance with the disclosure herein without departing from the spirit or scope of the disclosure. Modifications are possible in the described embodiments, and other embodiments are possible, within the scope of the claims. Thus, the breadth and scope of the present invention should not be limited by any of the examples described above. Rather, the scope of the disclosure should be defined in accordance with the following claims and their equivalents.

What is claimed is:

1. A semiconductor package, comprising:
   a patch antenna formed in a first conductor layer of a multilayer package substrate, the multilayer package substrate comprising conductor layers spaced from one another by dielectric material and coupled to one another by conductive vertical connection layers, the multilayer package substrate having a board side surface opposite a device side surface;
   a semiconductor die mounted to the device side surface of the multilayer package substrate spaced from and coupled to the patch antenna; and
   an antenna horn mounted to the device side surface and aligned with the patch antenna.

2. The semiconductor package of claim 1, further comprising:
a reflector formed on a second conductor layer in the multilayer package substrate, the second conductor layer positioned closer to the board side surface of the multilayer package substrate compared to the patch antenna, the reflector aligned with and spaced from the patch antenna.

3. The semiconductor package of claim 1, wherein the first conductor layer forms a portion of the device side surface of the multilayer package substrate.

4. The semiconductor package of claim 1, wherein the first conductor layer is below and spaced apart from the device side surface of the multilayer package substrate.

5. The semiconductor package of claim 1, further comprising:
a ground layer formed on a second conductor layer in the multilayer package substrate, wherein the second conductor layer forms a portion of the device side surface of the multilayer package substrate.

6. The semiconductor package of claim 1, further comprising:
a ground layer formed on the first conductor layer in the multilayer package substrate, wherein the first conductor layer forms a portion of the device side surface of the multilayer package substrate, and wherein the ground layer surrounds the patch antenna on the device side surface.

7. The semiconductor package of claim 1, wherein the antenna horn is coupled to the device side surface using solder.

8. The semiconductor package of claim 1, further comprising:
a mounting structure formed on the device side surface of the multilayer package substrate, the mounting structure configured to define a desired position of the antenna horn and to attach the antenna horn to the multilayer package substrate.

9. The semiconductor package of claim 8, wherein the mounting structure comprises a first elevated trace formed on the device side surface of the multilayer package substrate.

10. The semiconductor package of claim 9, wherein the mounting structure further comprises a second elevated trace formed on the device side surface of the multilayer package substrate, and wherein the first elevated trace surrounds the second elevated trace.

11. The semiconductor package of claim 9, wherein the first elevated trace comprises a solid line of material built-up on the device side surface.

12. The semiconductor package of claim 9, wherein the first elevated trace comprises a segmented line of material built-up on the device side surface.

13. The semiconductor package of claim 8, wherein the antenna horn is coupled to the mounting structure using solder.

14. The semiconductor package of claim 1, wherein the semiconductor die and the device side surface of the multilayer package substrate are covered with mold compound, an outside surface of the antenna horn is surrounded by the mold compound, and an interior of the antenna horn is filled with the mold compound.

15. The semiconductor package of claim 1, wherein the semiconductor die and the device side surface of the multilayer package substrate are covered with mold compound, an outside surface of the antenna horn is surrounded by the mold compound, and an interior of the antenna horn is exposed from the mold compound.

16. A microelectronic device package, comprising:
a multilayer package substrate comprising conductor layers spaced from one another by dielectric material, and comprising vertical connections extending through the dielectric material between the conductor layers and coupling portions of the conductor layers one to another, the multilayer package substrate having a device side surface and an opposite board side surface;
an antenna formed in a first conductor layer at or below the device side surface of the multilayer package substrate;
a reflector formed in a second conductor layer of the multilayer package substrate, the reflector aligned with and spaced away from the antenna by the dielectric material toward the board side surface;
a ground plane formed at the device side surface of the multilayer package substrate;
an antenna horn mounting structure formed on the ground plane and extending above the device side surface;
an antenna horn positioned on the mounting structure and aligned with the antenna; and
a semiconductor die mounted to the device side surface of the multilayer package substrate and coupled to the antenna.

17. The microelectronic device package of claim 16, wherein the antenna further comprises a planar antenna that is a rectangular, circular, triangular, oval, or E-patch shape.

18. The microelectronic device package of claim 16, wherein the antenna horn mounting structure comprises two concentric rings spaced apart to form a slot, and wherein the slot is adapted to receive walls of the antenna horn.

19. The microelectronic device package of claim 16, wherein the semiconductor die and the device side surface of the multilayer package substrate are covered with mold compound, an outside surface of the antenna horn is surrounded by the mold compound, and an interior of the antenna horn is filled with the mold compound.

20. The microelectronic device package of claim 16, wherein the semiconductor die and the device side surface of the multilayer package substrate are covered with mold compound, an outside surface of the antenna horn is surrounded by the mold compound, and an interior of the antenna horn is exposed from the mold compound.

* * * * *